(12) United States Patent
Tsutsui et al.

(10) Patent No.: US 9,051,653 B2
(45) Date of Patent: Jun. 9, 2015

(54) ROLLING BEARING

(75) Inventors: Hideyuki Tsutsui, Mie (JP); Kouya Oohira, Mie (JP); Naoko Ito, Mie (JP)

(73) Assignee: NTN CORPORATION, Osaka (JP)

( * ) Notice: Subject to any disclaimer, the term of this patent is extended or adjusted under 35 U.S.C. 154(b) by 0 days.

(21) Appl. No.: 13/637,953

(22) PCT Filed: Mar. 30, 2011

(86) PCT No.: PCT/JP2011/058018
§ 371 (c)(1),
(2), (4) Date: Sep. 27, 2012

(87) PCT Pub. No.: WO2011/122662
PCT Pub. Date: Oct. 6, 2011

(65) Prior Publication Data
US 2013/0016937 A1    Jan. 17, 2013

(30) Foreign Application Priority Data

Mar. 30, 2010  (JP) .................................. 2010-079276
Mar. 30, 2010  (JP) .................................. 2010-079300
Sep. 27, 2010  (JP) .................................. 2010-215671
Mar. 10, 2011  (JP) .................................. 2011-053567

(51) Int. Cl.
*F16C 33/32*        (2006.01)
*C23C 28/00*        (2006.01)
(Continued)

(52) U.S. Cl.
CPC ............... *C23C 28/00* (2013.01); *C23C 14/024* (2013.01); *C23C 14/025* (2013.01); *C23C 14/027* (2013.01); *C23C 14/0605* (2013.01); *C23C 14/35* (2013.01); *C23C 14/568* (2013.01); *F16C 33/427* (2013.01); *F16C 33/445* (2013.01); *F16C 33/62* (2013.01); *F16C 33/30* (2013.01);

(Continued)

(58) Field of Classification Search
CPC .......... F16C 19/06; F16C 33/30; F16C 33/32; F16C 33/427; F16C 33/445; F16C 33/62; F16C 2202/04; F16C 2206/02; F16C 2206/04; F16C 2206/82
USPC ............... 384/912–913, 907, 907.1, 492, 569
See application file for complete search history.

(56) References Cited

U.S. PATENT DOCUMENTS 6,329,326 B1 * 12/2001 Iso et al. ........................ 508/182
6,471,410 B1 * 10/2002 Jacobson et al. .............. 384/492

(Continued)

FOREIGN PATENT DOCUMENTS

CN  101081557 A   12/2007
CN  101464528 A    6/2009

(Continued)

*Primary Examiner* — James Pilkington
(74) *Attorney, Agent, or Firm* — Hedman & Costigan, P.C.; James V. Costigan; Kathleen A. Costigan

(57) ABSTRACT

The present invention provides a rolling bearing in which the peeling resistances of a DLC film formed on raceway of inner and outer rings and a sliding surface of a cage are improved to allow the intrinsic properties of the DLC film to be displayed so that the rolling bearing is excellent in its resistance to seizing, wear, and corrosion. A rolling bearing (1) has an inner ring (2), an outer ring (3), a plurality of rolling elements (4), and a cage (5). A hard film (8) is formed on a curved surface such as a raceway (2*a*) of the inner ring (2), a raceway (3*a*) of the outer ring (3), and the like. The hard film (8) is composed of a foundation layer, composed mainly of Cr, which is formed directly on the curved surface.

21 Claims, 12 Drawing Sheets

(51) Int. Cl.
| | |
|---|---|
| *C23C 14/02* | (2006.01) |
| *C23C 14/06* | (2006.01) |
| *C23C 14/35* | (2006.01) |
| *C23C 14/56* | (2006.01) |
| *F16C 33/42* | (2006.01) |
| *F16C 33/44* | (2006.01) |
| *F16C 33/62* | (2006.01) |
| *F16C 33/30* | (2006.01) |
| *C23C 14/34* | (2006.01) |

(52) U.S. Cl.
CPC .............. *C23C 14/345* (2013.01); *C23C 28/322* (2013.01); *C23C 28/34* (2013.01); *C23C 28/341* (2013.01); *C23C 28/343* (2013.01); *C23C 28/347* (2013.01); *C23C 28/36* (2013.01); *F16C 2206/04* (2013.01)

(56) References Cited

U.S. PATENT DOCUMENTS

| | | | | |
|---|---|---|---|---|
| 6,994,475 B2* | 2/2006 | Doll et al. | ............ | 384/492 |
| 7,322,749 B2* | 1/2008 | Konishi et al. | ............ | 384/13 |
| 7,427,162 B2* | 9/2008 | Kano et al. | ............ | 384/492 |
| 2002/0061150 A1* | 5/2002 | Ueda et al. | ............ | 384/492 |
| 2003/0185478 A1* | 10/2003 | Doll et al. | ............ | 384/492 |
| 2004/0213495 A1* | 10/2004 | Kahlman | ............ | 384/624 |
| 2009/0283710 A1* | 11/2009 | Bertini et al. | ............ | 251/324 |
| 2010/0086250 A1* | 4/2010 | Evans et al. | ............ | 384/571 |

FOREIGN PATENT DOCUMENTS

| | | |
|---|---|---|
| CN | 201301906 Y | 9/2009 |
| CN | 101619455 A | 1/2010 |
| JP | 2000-119843 A | 4/2000 |
| JP | 2001-225412 A | 8/2001 |
| JP | 2001-304275 A | 10/2001 |
| JP | 2003-254340 A | 9/2003 |
| JP | 2005-147244 A | 6/2005 |
| JP | 2005-147306 A | 6/2005 |
| JP | 2006-300294 A | 11/2006 |
| JP | 2007-092012 A | 4/2007 |
| JP | 3961739 B | 5/2007 |
| JP | 4178826 B2 | 9/2008 |
| JP | 2008-304018 A | 12/2008 |

* cited by examiner (a)  (b)

(a)   (b)

ROLLING BEARING

CROSS-REFERENCE TO RELATED APPLICATIONS

Not Applicable

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISK

Not Applicable

REFERENCE TO A MICROFICHE APPENDIX

Not Applicable

BACKGROUND OF THE INVENTION

1. Field of the Invention

The present invention relates to a rolling bearing. More particularly the present invention relates to a rolling bearing in which a hard film, having a predetermined structure, which contains diamond-like carbon is formed on a raceway and a sliding contact surface of a cage.

2. Description of Related Art

A hard carbon film is a hard film called diamond-like carbon (hereinafter referred to as DLC. Film/layer containing DLC as its main component is also called DLC film/layer). Various naming is given to the hard carbon. For example, it is called a hard amorphous carbon, amorphous carbon, hard amorphous-type carbon, i-carbon, and diamond-shaped carbon. These terms are not clearly distinguished from one another.

As the essential quality of the DLC, the DLC has a structure in which diamond and graphite are mixed with each other and is thus the structure is intermediate between that of the diamond and that of the graphite. The DLC has a high hardness almost equal to that of the diamond and is excellent in its wear resistance, solid lubricating property, thermal conductivity, chemical stability, and corrosion resistance. Therefore the DLC is utilized as protection films of dies, tools, wear-resistant mechanical parts, abrasive materials, sliding members, magnetic and optical parts. As methods of forming the DLC film, a physical vapor deposition (hereinafter referred to as PVD) method such as a sputtering method and an ion plating method; a chemical vapor deposition (hereinafter referred to as CVD) method; and unbalanced magnetron sputtering (hereinafter referred to as UBMS) method are adopted.

Attempts are made to form the DLC film on the raceway of a bearing ring of a rolling bearing, the rolling contact surface of a rolling element thereof, the sliding contact surface of a cage thereof. The DLC film generates a very large internal stress when the DLC film is formed. Although the DLC film has a high hardness and Young's modulus, it has a very small deformability. Thus the DLC film has disadvantages that it is low in its adhesiveness to a base material and liable to peel therefrom. Therefore in forming the DLC film on the above-described surfaces of the bearing members of the rolling bearing, it is necessary to improve its adhesiveness to the surface of the base material.

To improve the adhesiveness of the DLC film to the base material by forming the intermediate layer, there is proposed the rolling apparatus. The rolling apparatus has the foundation layer, formed on the raceway groove or the rolling contact surface of the rolling element made of an iron and steel material, which contains any one or more elements selected from among chromium (hereinafter referred to as Cr), tungsten (hereinafter referred to as W), titanium (hereinafter referred to as Ti), silicon (hereinafter referred to as Si), nickel, and iron as its composition; the intermediate layer, formed on the foundation layer, which contains the same constituent elements as those of the foundation layer and carbon such that the content rate of the carbon is larger at the side opposite to the foundation layer than at the side of the foundation layer; and the DLC film, formed on the intermediate layer, which consists of argon and carbon such that the content rate of the argon is not less than 0.02 mass % nor more than 5 mass % (see patent document 1). To improve the adhesiveness of the DLC film to the base material by forming the intermediate layer, there is proposed the cage of the rolling bearing on which a plurality of films is formed such that the intermediate layer having the predetermined hardness is interposed between the film of the uppermost layer and the cage (see patent document 2).

To improve the adhesiveness of the DLC film to the base material by an anchoring effect, there is proposed the rolling bearing in which irregularities whose height is 10 to 100 nm and average width is not more than 300 nm are formed on the raceway by means of ion bombardment process and the DLC film is formed on the raceway (see patent document 3).

In addition, there is proposed the cage composed of the hardened layer, subjected to the predetermined treatment, which is formed on the surface of the base material; the hard film, having a higher hardness than the hardened layer and coating the hardened layer therewith, which is formed on the surface of the hardened layer; and the soft film, having a solid lubrication effect and coating the hard film therewith, which is formed on the surface of the hard film. There is also proposed the method of producing this cage.

Because the rolling bearing in which the fluorine grease is packed is excellent in its high-temperature durability, it is used as a bearing for the engine room of a car and as a bearing for the toner-fixing part of a copying machine, a printer, and the like. In addition, because the fluorine grease-packed rolling bearing is excellent in its vapor pressure property, it is frequently used for vacuum equipments. When a large amount of the fluorine grease is present, it displays a favorable lubricating property. But when the supply of the fluorine grease to a rolling contact portion and a sliding portion is short, and thereby boundary lubrication may occur. As a result, a reaction takes place between perfluoropolyether (hereinafter referred to as PFPE) oil which is the base oil fluorine grease and steel (iron) which is a material of the bearing, with the result that the base oil decomposes and the steel wears and the bearing has a short life. Further because this reaction causes the PFPE oil to deteriorate and consumption thereof to be increased, the amount of a utilizable lubricating agent decreases significantly. Consequently these phenomena have a synergistic effect on the bearing, thus causing the bearing to have a short life and a phenomenon such as seizing to occur.

As means for restraining the reaction between the PFPE oil and the steel, there is proposed the fluorine grease contains the organic compound capable of forming a film on the surface of the metal (see patent document 6). It is conceivable that the reaction between the PFPE oil and the steel can be restrained by coating the steel with the hard film such as the above-described DLC film.

PRIOR ART DOCUMENT

Patent Document

Patent document 1: U.S. Pat. No. 4,178,826
Patent document 2: Japanese Patent Application Laid-Open No. 2006-300294
Patent document 3: U.S. Pat. No. 3,961,739
Patent document 4: Japanese Patent Application Laid-Open No. 2005-147306
Patent document 5: Japanese Patent Application Laid-Open No. 2005-147244
Patent document 6: Japanese Patent Application Laid-Open No. 2007-92012

SUMMARY OF THE INVENTION

But the raceway of the inner and outer rings of the rolling bearing which guide the rolling element are formed not as flat surfaces, but as curved surfaces in the configurations thereof. Some of the raceway have configurations in which main and sub-curvatures are combined with each other. The rolling contact surface of the rolling element has the configuration of a circumferential surface in the case where the rolling element is a cylindrical roller and spherical surface in the case where the rolling element is a ball. The sliding contact surface of a cage is a surface (pocket surface of cage) which contacts the rolling element and a bearing ring and has the configuration of a curved surface. When the DLC film is formed on the surfaces having the above-described configurations, there is a fear that in dependence on the structure thereof and a film-forming condition, a residual stress inside the DLC film becomes large and the DLC film peels off the surfaces having the above-described configurations immediately after the DLC film is formed thereon. Even though the DLC film does not peel off the surfaces immediately after it is formed thereon, there is a fear that the DLC film peels therefrom when it receives a rolling contact-caused load, an impact force, and a load such as a thermal impact generated by a local sliding contact when the bearing is in operation.

When the DLC film peels from the surfaces of the bearing members, metal contact occurs between bearing members. As a result, the members wear. Thereby worn powders enter the rolling contact surface, which leads to damage of the raceway. In the case where grease lubrication is performed, the deterioration of grease may be accelerated owing to a catalytic action of a newly generated metallic surface. When the DLC film peels from the surfaces of the bearing members in the case where fluorine grease is packed in the bearing, the problem of the reaction between the PFPE oil and the steel is conspicuous.

The arts of the above-described patent documents are intended to prevent the peeling of the DLC film from the surfaces of the bearing members. But to improve the practical use of the obtained rolling bearings, there is room for improvement of the film structures and the film-forming conditions in forming the DLC film on the surfaces of the bearing members.

The present invention has been made to deal with the above-described problems. It is an object of the present invention to provide a rolling bearing in which the peeling resistances of a DLC film formed on raceway of inner and outer rings and a sliding surface of a cage are improved to allow the intrinsic properties of the DLC film to be displayed so that the rolling bearing is excellent in its resistance to seizing, wear, and corrosion. It is another object of the present invention to provide a rolling bearing in which the DLC film is capable of restraining a reaction between fluorine and copper.

The rolling bearing of the present invention has an inner ring having a raceway on an outer circumferential surface thereof, an outer ring having a raceway on an inner circumferential surface hereof, a plurality of rolling elements which roll between the raceway of the inner ring and the raceway of the outer ring, and a cage retaining the rolling elements. At least one bearing member selected from among the inner ring, the outer ring, the rolling elements, and the cage is made of an iron-based material. The bearing member made of the iron-based material have a curved surface, a hard film is formed on a curved surface, the curved surface is at least one curved surface selected from among the raceway of the inner ring, the raceway of the outer ring, the rolling contact surfaces of the rolling elements, and a sliding contact surface of the cage. The hard film is composed of a foundation layer, composed mainly of chromium, which is formed directly on the curved surface; a mixed layer, composed mainly of tungsten carbide (hereinafter referred to as WC) and DLC, which is formed on the foundation layer; and a surface layer, composed mainly of the DLC, which is formed on the mixed layer. In the mixed layer, a content rate of the WC becomes lower continuously or stepwise in a direction from a side of the foundation layer toward a side of the surface layer, and a content rate of the DLC in the mixed layer becomes higher continuously or stepwise in the direction.

The rolling elements are balls; and the raceway of the inner ring and the raceway of the outer ring are curved surfaces which guide the rolling elements.

The rolling elements are balls; and the sliding contact surface of the cage is a pocket surface which retains the balls thereon and allows the rolling elements to slide thereon.

The surface layer has a gradient layer part, disposed at a side adjacent to the mixed layer, a hardness of which becomes higher continuously or stepwise from the mixed layer.

The surface layer consists of a film formed by using an unbalanced magnetron sputtering apparatus using argon (hereinafter referred to as Ar) gas as a sputtering gas. The surface layer is formed by using a graphite target and a hydrocarbon-based gas in combination as a carbon supply source and depositing carbon atoms generated by the carbon supply source on the mixed layer in conditions in which a rate of an introduction amount of the hydrocarbon-based gas to 100 which is an introduction amount of the argon gas into the apparatus is set to 1 to 5, a vacuum degree inside the apparatus is set to 0.2 to 0.8 Pa, and a bias voltage to be applied to the bearing member which is a base material is set to 70 to 150V. The hydrocarbon-based gas is methane gas.

The electric potential is so applied to the bearing member which is the base material as to be minus with respect to the ground potential. For example, the bias voltage of 150V means that the bias potential of the base material is −150V with respect to the ground potential.

The gradient layer part of the surface layer consists of a film formed by continuously or stepwise increasing the bias voltage to be applied to the bearing member which is the base material.

Each of the foundation layer and the mixed layer consists of a film formed by using an unbalanced magnetron sputtering apparatus using argon gas as a sputtering gas. The mixed layer consists of a film formed by continuously or stepwise raising a sputtering electric power to be applied to a graphite target serving as a carbon supply source and by continuously or stepwise lowering a sputtering electric power to be applied to a WC target.

When a mating material consisting of a quenched steel of SUJ2 having a surface roughness Ra of not more than 0.01 μm and Vickers hardness Hv of 780 is rotated at a rotational speed of 0.05 m/s for 30 minutes with the hard film being in contact with the mating material by applying a load of 0.5 GPa in a Hertzian maximum contact surface pressure to the hard film, a specific wear amount of the hard film is less than $200 \times 10^{-10}$ mm$^3$/(N·m). In the hard film, a sum of an average value of indentation hardnesses and a standard deviation value is 25 to 45 GPa. A critical peeling load of the hard film in a scratch test is not less than 50N.

A thickness of the hard film is 0.5 to 3.0 μm; and a ratio of a thickness of the surface layer to that of the hard film is not more than 0.8.

The iron-based material is selected from among high carbon chromium bearing steel, carbon steel, tool steel or martensitic stainless steel. A hardness of a surface on which the hard film is to be formed is not less than 650 in Vickers hardness Hv.

The iron-based material constructing the inner ring, the outer ring, and the rolling elements is the high carbon chromium bearing steel, the carbon steel, the tool steel or the martensitic stainless steel. The hardness of a curved surface of each of the inner ring, the outer ring, and the rolling elements on which the hard film is to be formed is not less than 650 in Vickers hardness Hv.

An iron-based material constructing the cage is a cold-rolled steel plate, carbon steel, chromium steel, chromium molybdenum steel, nickel chromium molybdenum steel or austenitic stainless steel. A hardness of a curved surface of the cage on which the hard film is to be formed is not less than 450 in Vickers hardness Hv.

Before the hard film is formed on the curved surface on which the hard film is to be formed, a nitrided layer is formed thereon by performing nitriding treatment. As the nitriding treatment, plasma nitriding treatment is performed; and a hardness of the curved surface subjected to the nitriding treatment is not less than 1000 in Vickers hardness Hv.

A surface roughness Ra of the curved surface of each of the inner ring, the outer ring, and the rolling elements on which the hard film is to be formed is not more than 0.05 μm. A surface roughness Ra of the curved surface of the cage on which the hard film is to be formed is not more than 0.5 μm.

Grease is packed in the rolling bearing. The grease is fluorine grease composed of base oil consisting of PFPE oil and a thickener consisting of fluororesin powders.

In the rolling bearing of the present invention, the hard film having the predetermined membrane structure containing the DLC is formed on the curved surface of the bearing member consisting of the iron-based material. The foundation layer, consisting of the Cr, which is directly formed on the curved surfaces is compatible with the iron-based material and superior to W and Si in its adhesiveness. The WC to be used for the mixed layer has a hardness and a modulus of elasticity intermediate between those of the Cr and the DLC, and the concentration of a stress little occurs after the hard film is formed. By allowing the mixed layer composed of the WC and the DLC to have the gradient composition, the mixed layer has a structure in which the WC and the DLC are physically connected to each other.

Owing to the above-described structure, the hard film formed on the curved surfaces such as the raceway of the inner and outer rings, the rolling contact surfaces of the rolling elements, and the sliding contact surface of the case is excellent in its peeling resistances and is capable of displaying the intrinsic properties of the DLC film. Consequently the rolling bearing of the present invention is excellent in its resistance to seizing, wear, and corrosion. The raceway, the sliding contact surface of the case, and the like are little damaged even in a strict lubrication state and thus the rolling bearing has along life.

When fluorine grease or the like is packed in the rolling bearing, the hard film is capable of restraining the reaction between fluorine and copper, preventing the decomposition of the base oil and the abrasion of copper, and allowing the intrinsic heat resistance and lubricating property of the fluorinated oil to be utilized and the rolling bearing to have a long life.

DETAILED DESCRIPTION OF THE INVENTION

Brief Description of the Several Views of the Drawings

At least one bearing member of the rolling bearing of the present invention selected from among its inner ring, outer ring, rolling elements, and the cage is made of an iron-based material. The portion on which the hard film is to be formed is (1) curved surfaces of the bearing members made of the iron-based material and (2) at least one curved surface selected from among the raceway of the inner ring, the raceway of the outer ring, the rolling contact surfaces of the rolling elements, and the sliding contact surface of the cage. It is preferable to form the hard film on the curved surfaces of the bearing members made of the iron-based material which contact each other.

Figure 1:
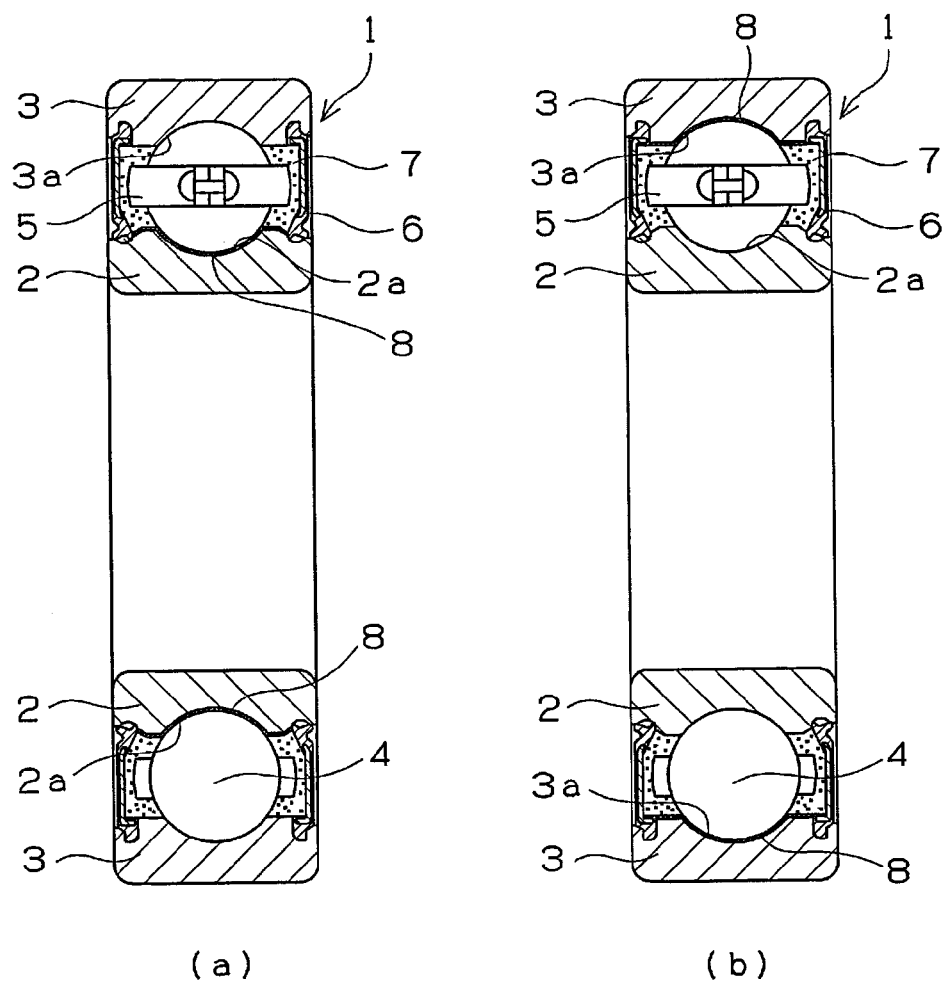
FIG. 1 is a sectional view showing an example of a rolling bearing of the present invention.
Figure 2:
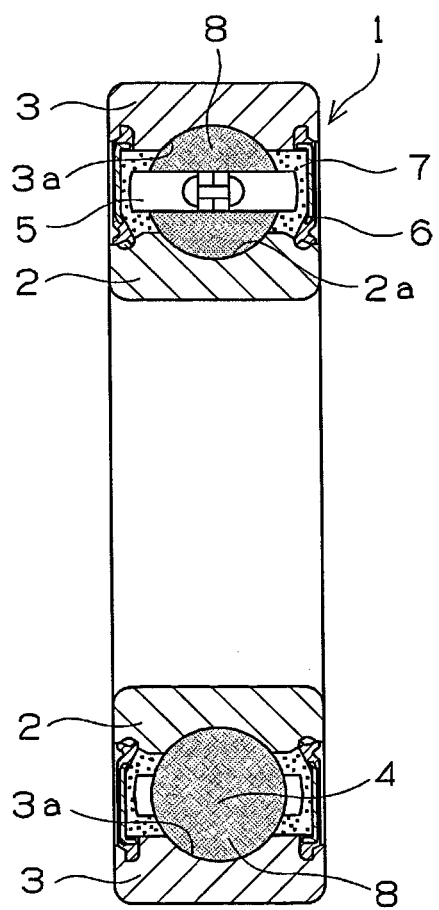
FIG. 2 is a sectional view showing another example of the rolling bearing of the present invention.
Figure 3:
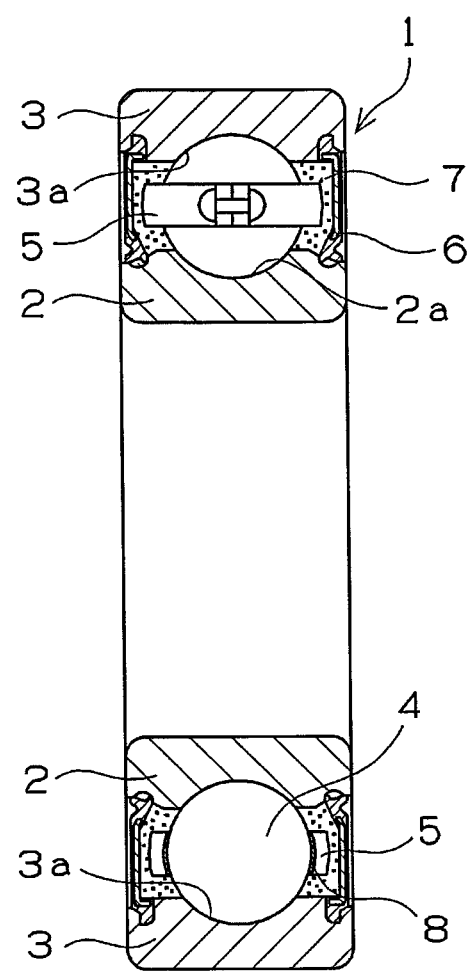
FIG. 3 is a sectional view showing still another example of the rolling bearing of the present invention.
Figure 4:
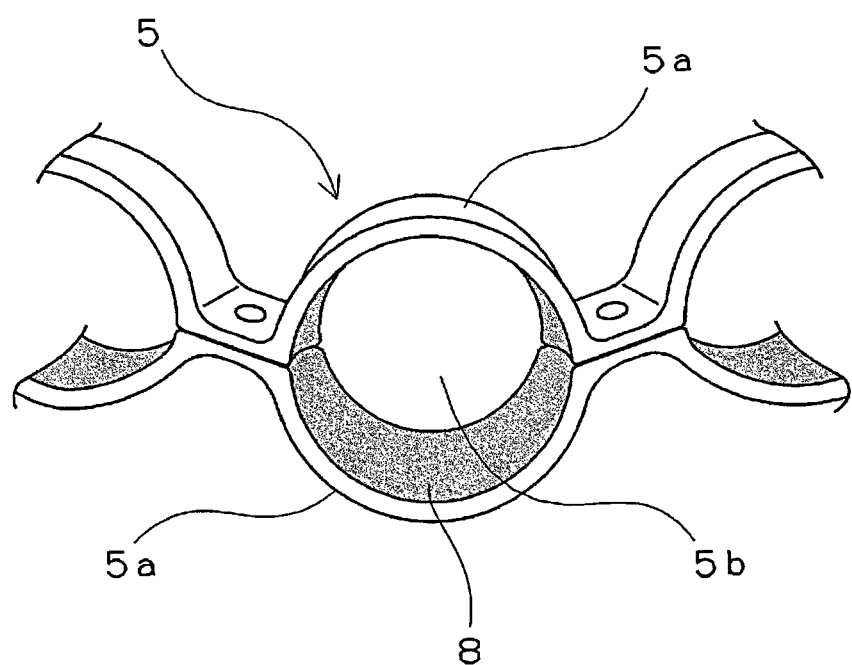
FIG. 4 is an enlarged view of a cage shown in FIG. 3.

The rolling bearing of the present invention is described below with reference to FIGS. 1 through 4. FIG. 1 shows a sectional view of the rolling bearing (deep groove ball bearing) where a hard film is formed on the raceway of each of an inner ring and an outer ring. FIG. 2 shows a sectional view of the rolling bearing (deep groove ball bearing) where the hard film is formed on the rolling contact surfaces of rolling elements. FIG. 3 shows a sectional view of the rolling bearing (deep groove ball bearing) where the hard film is formed on the pocket surface of the cage. FIG. 4 shows an enlarged view of the cage shown in FIG. 3.

As shown in FIG. 1, a rolling bearing 1 has an inner ring 2 having an inner ring raceway 2a on its outer circumferential surface, an outer ring 3 having an outer ring raceway 3a on its inner circumferential surface, a plurality of rolling elements 4 which rolls between the inner ring raceway 2a and the outer ring raceway 3a, a cage 5 retaining the rolling elements 4 at regular intervals. A sealing member 6 seals an opening formed at each of axial ends of the inner and outer rings. A grease 7 is packed inside the rolling bearing 1. The grease 7 is packed at least on the periphery of each rolling element 4.

In the rolling bearing shown in FIG. 1(a), a hard film 8 is formed on the outer circumferential surface (raceway 2a of inner ring is included) of the inner ring 2. In the rolling bearing shown in FIG. 1(b), the hard film 8 is formed on the inner circumferential surface (raceway 3a of outer ring is included) of the outer ring 3. In the case where the hard film 8 is formed on the inner ring and the outer ring, it is necessary to form the hard film 8 on at least the raceway thereof. Thus as shown in each of FIGS. 1(a) and 1(b), the hard film 8 may be formed on the entire outer circumferential surface of the inner ring and the entire outer circumferential surface of the outer ring or on the entire inner and outer rings.

In the rolling bearing shown in FIG. 2, the hard film 8 is formed on the rolling contact surface of the rolling element 4. Because the rolling bearing shown in FIG. 2 is the deep groove ball bearing, the rolling elements thereof are balls, and the rolling contact surface of each of the rolling elements is entirely a spherical surface. Supposing that a cylindrical roller bearing or a tapered roller bearing is used as the rolling bearing other than the one shown in the drawings, when the hard film 8 is formed on the rolling elements thereof, it is necessary to form the hard film 8 at least on the rolling contact surfaces (cylindrical outer circumference) of the rolling elements.

As shown in FIGS. 1 and 2, to guide balls which are the rolling elements 4, the raceway 2a of the inner ring of the deep groove ball bearing is a curved surface which is circular arc groove-shaped in its axial sectional view. Similarly the raceway 3a of the outer ring of the deep groove ball bearing is a curved surface which is circular arc groove-shaped in its axial sectional view. Supposing that the diameter of a steel ball is dw, the radius of curvature of the circular arc groove is 0.51 to 0.54 dw. In the case where the cylindrical roller bearing or the tapered roller bearing is used as the rolling bearing other than the one shown in the drawings, to guide balls of these bearings, the raceway of each of the inner ring and the outer ring is formed as a curved surface in at least the circumferential direction thereof. Because a barrel-shaped roller is used as the rolling element in the case of a self-aligning roller bearing, the raceway of each of the inner ring and the outer ring is formed as a curved surface in the axial direction thereof in addition to the circumferential direction thereof. The raceway of each of the inner ring and the outer ring of the rolling bearing of the present invention may have any of the above-described configurations.

In the rolling bearing shown in FIG. 3, the hard film 8 is formed on the sliding contact surface of the cage 5. As shown in FIG. 4, the cage 5 consists of a corrugated iron plate and is produced by combining two members 5a, 5a formed by press-molding an iron-based material to be described later with each other and has a cage pocket 5b retaining the balls which are the rolling element 4. The inner circumferential surface (pocket surface) of the cage pocket 5b is the sliding contact surface on which the rolling elements 4 slide. The hard film 8 is formed on the pocket surface. It is necessary to form the hard film 8 on at least one sliding contact surface selected from among the sliding contact surface between the pocket surface of the cage 5 and the bearing ring (inner ring 2 or outer ring 3) and the sliding contact surface between the pocket surface of the cage 5 and the rolling element 4. The hard film may be formed on the raceway 2a of the inner ring, the raceway 3a of the outer ring, and the raceway of the rolling elements 4 shown in FIGS. 1 and 2 in addition to the sliding contact surface of the cage 5.

As the iron-based material constructing the inner ring 2, the outer ring 3, and the rolling elements 4 on which the hard film 8 is to be formed, it is possible to use an arbitrary steel stock generally used as a material of the bearing members. For example, high carbon chromium bearing steel, carbon steel, tool steel, martensitic stainless steel are listed. It is preferable that the hardness of the curved surface of each of these bearing members (inner ring 2, outer ring 3, and rolling elements 4) on which the hard film is to be formed is not less than 650 in Vickers hardness Hv. By setting the hardness of the curved surface of each of the bearing members to not less than 650 in Vickers hardness Hv, it is possible to decrease the difference between the hardness of the curved surface of each of the bearing members and that of the hard film (foundation layer) and improve the adhesiveness therebetween.

It is preferable that a surface roughness Ra of the curved surface of each of the inner ring 2, the outer ring 3, and the rolling element 4 on which the hard film 8 is to be formed is not more than 0.05 µm. When the surface roughness Ra exceeds 0.05 µm, it is difficult to form the hard film on the upper ends of projections of irregularities of the curved surface of each of the above-described bearing members, and the thickness of the formed hard film is locally small.

As the iron-based material constructing the cage 5 on which the hard film 8 is to be formed, it is possible to use an arbitrary material generally used as a material of the cage. For example, a cold-rolled steel plate, carbon steel, chromium steel, chromium molybdenum steel, nickel chromium molybdenum steel, and austenitic stainless steel are listed. The hardness of the sliding contact surface (curved surface) of the cage 5 on which the hard film 8 is to be formed is favorably not less than 190 and more favorably not less than 450 in the Vickers hardness Hv. By setting the Vickers hardness Hv of the sliding contact surface to not less than 450, it is possible to decrease the difference between the hardness of the sliding contact surface and that of the hard film (foundation layer) to a possible highest extent and improve the adhesiveness therebetween.

It is preferable that a surface roughness Ra of the sliding contact surface (curved surface) of the cage 5 on which the hard film 8 is to be formed is not more than 0.5 µm. When the surface roughness Ra exceeds 0.5 µm, the hard film formed at the upper ends of the projections of the irregularities of the sliding contact surface thereof is liable to peel therefrom owing to a local concentration of a stress when the rolling elements slide on the sliding contact surface thereof and in addition, because it is difficult to sufficiently remove dirt from the sliding contact surface thereof, the hard film formed on the dirt may easily peel therefrom.

It is preferable to form a nitrided layer on the curved surface of the base material of each of the bearing members on which the hard film 8 is to be formed by performing nitriding treatment before the hard film 8 is formed thereon. As the nitriding treatment, it is preferable to subject the surface of the base material to the plasma nitriding treatment because the plasma nitriding treatment makes it difficult for an oxidized layer which prevents the adhesiveness between the hard film and the curved surface of each of the bearing members to be formed. It is preferable that the hardness of the curved surface (surface) of the base material each of the bearing members subjected to the nitriding treatment is not less than 1000 in the Vickers hardness Hv to further improve the adhesiveness between the hard film (foundation layer) and the curved surface of the base material of each of the bearing members.

Figure 5:
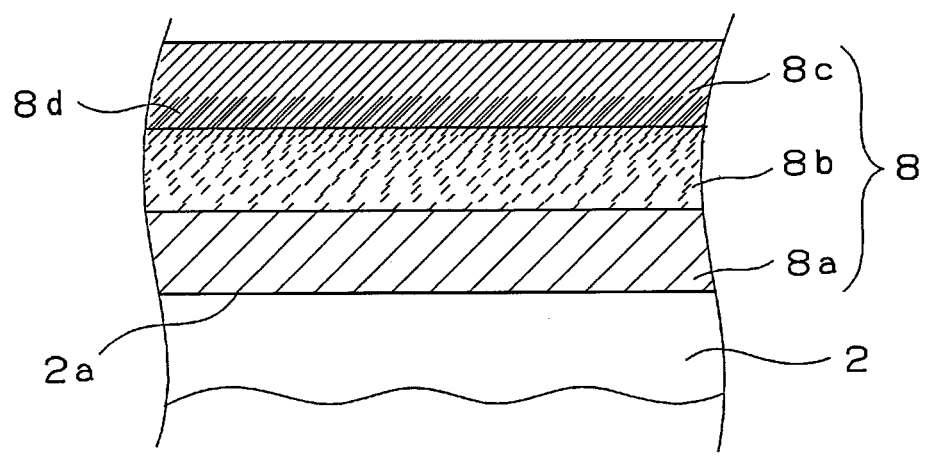
FIG. 5 is a sectional pattern diagram showing the structure of a hard film.

The structure of the hard film of the present invention is described below with reference to FIG. 5. FIG. 5 is a pattern sectional diagram showing the structure of the hard film 8 shown in FIG. 1. As shown in FIG. 5, the hard film 8 has a three-layer structure composed of (1) a foundation layer 8a, composed mainly of Cr, which is formed directly on the raceway 2a of the inner ring 2, (2) a mixed layer 8b, composed mainly of WC and DLC, which is formed on the foundation layer 8a, and (3) a surface layer 8c, composed mainly of the DLC, which is formed on the mixed layer 8b. In the mixed layer 8b, the content rate of the WC becomes lower continuously or stepwise in a direction from the side of the foundation layer 8a toward the side of the surface layer 8c, whereas that of the DLC becomes higher continuously or stepwise in the above-described direction.

Because the foundation layer 8a is composed mainly of the Cr, the foundation layer 8a is compatible with the bearing member made of the iron-based material forming the base material thereof. Thus the foundation layer 8a composed mainly of the Cr is superior to foundation layers composed of W, Ti or Si in the adhesiveness to the base material of the bearing member. The foundation layer 8a is particularly excellent in the adhesiveness to the high carbon chromium bearing steel to be used as a material of the bearing ring of the bearing.

The WC to be used for the mixed layer 8b has a hardness and a modulus of elasticity intermediate between that of the Cr and that of the DLC, and the concentration of the residual stress little occurs after the film of the mixed layer 8b is formed. When the mixed layer 8b is composed mainly of the Cr and the DLC to conform the composition of the mixed layer 8b to that of the foundation layer 8a, the hard film is incapable of obtaining a sufficient adhesiveness to the bearing member when the bearing is in operation. In forming the hard film containing the DLC excellent in its peeling resistance on the curved raceway of the inner ring and the outer ring of the rolling bearing and on the rolling contact surfaces of the rolling elements, the selection of the material for the intermediate layer (mixed layer 8b) is also an important element.

Because the mixed layer 8b has the gradient composition in which the content rate of the WC becomes lower and that of the DLC becomes higher toward the side of the surface layer 8c, the mixed layer 8b has an excellent adhesiveness to the upper surface of the foundation layer 8a and the lower surface of the surface layer 8c. The mixed layer has a structure in which the WC and the DLC are physically connected to each other and the content rate of the DLC becomes higher toward the side of the surface layer 8c. Therefore the adhesiveness between the surface layer 8c and the mixed layer 8b is excellent.

The surface layer 8c is composed mainly of the DLC. It is preferable that the surface layer 8c has a gradient layer part 8d, disposed at the side adjacent to the mixed layer 8b, whose hardness becomes higher continuously or stepwise from the side of the mixed layer 8b. When the bias voltage at the mixed layer 8b and that at the surface layer 8c are different from each other, to avoid a sudden change of the bias voltage, a bias voltage is changed (increased) continuously or stepwise. Thereby the gradient layer part 8d is obtained. The change in the bias voltage allows the hardness of the gradient layer part 8d to have a gradient, as described above. The reason the hardness of the gradient layer part 8d rises continuously or stepwise is because a structure ratio between a graphite structure ($sp^2$) and a diamond structure ($sp^3$) inclines toward the latter owing to the rise of the bias voltage. Thereby there is no rapid difference between the hardness of the mixed layer 8b and that of the surface layer 8c and thus the adhesiveness therebetween becomes further excellent.

It is preferable to set the thickness of the hard film 8 (total of three layers) to 0.5 to 3.0 µm. When the thickness of the hard film 8 is less than 0.5 µm, there is a case in which the hard film 8 is inferior in its wear resistance and mechanical strength. When the thickness thereof is more than 3.0 µm, the hard film 8 is liable to peel off the surface of the bearing member. It is also preferable that the ratio of the thickness of the surface layer 8c to that of the hard film 8 is not more than 0.8. When the above-described ratio exceeds 0.8, the gradient tissue for physically connecting the WC of the mixed layer 8b and the DLC thereof to each other is uncontinuous and thus there is a high possibility that the adhesiveness between the surface layer 8c and the mixed layer 8b deteriorates.

By composing the hard film 8 of the three layers composed of the foundation layer 8a, the mixed layer 8b, and the surface layer 8c, the hard film 8 is excellent in its peeling resistance.

As the properties of the hard film 8, when a mating material consisting of a quenched steel OF SUJ2 having a surface roughness Ra of not more than 0.01 µm and Vickers hardness Hv of 780 is rotated at a rotational speed of 0.05 m/s for 30 minutes with the hard film being in contact with the mating material by applying a load of 0.5 GPa in a Hertzian maximum contact surface pressure to the hard film, a specific wear amount of the hard film is less than $200 \times 10^{-10}$ mm$^3$/(N·m). The surface roughness of the mating material is low. Thus the form of the frictional wear test is an adhesion wear form similar to a wear form inside the bearing. When the specific wear amount of the hard film is $200 \times 10^{-10}$ mm$^3$/(N·m) in the test, the hard film is effective for decreasing wear against local sliding generated on the raceway and the sliding contact surface of the cage.

It is preferable that in the hard film, the sum of the average value of an indentation hardnesses and a standard deviation value is 25 to 45 GPa. In this range, a high effect can be displayed for abrasive wear generated when a hard foreign matter enters into the raceway and the sliding contact surface of the cage.

It is preferable that a critical peeling load of the hard film in a scratch test is not less than 50N. The method of measuring the critical peeling load in the scratch test is carried out as shown in the examples described below. When the critical peeling load is less than SON, there is a high possibility that the hard film peels off the surface of the bearing member of the bearing when the bearing is operated in a high load-applied condition. Even though the critical peeling load is not less than 50N, the hard film may easily peel off the surface of the bearing member unless the hard film has the membrane structure of the present invention.

The method of forming the hard film is described below. The hard film is obtained by forming the foundation layer 8a on the surface of the bearing member on which the hard film is to be formed, the mixed layer 8b on the foundation layer 8a, and the surface layer 8c on the mixed layer 8b.

Figure 6:
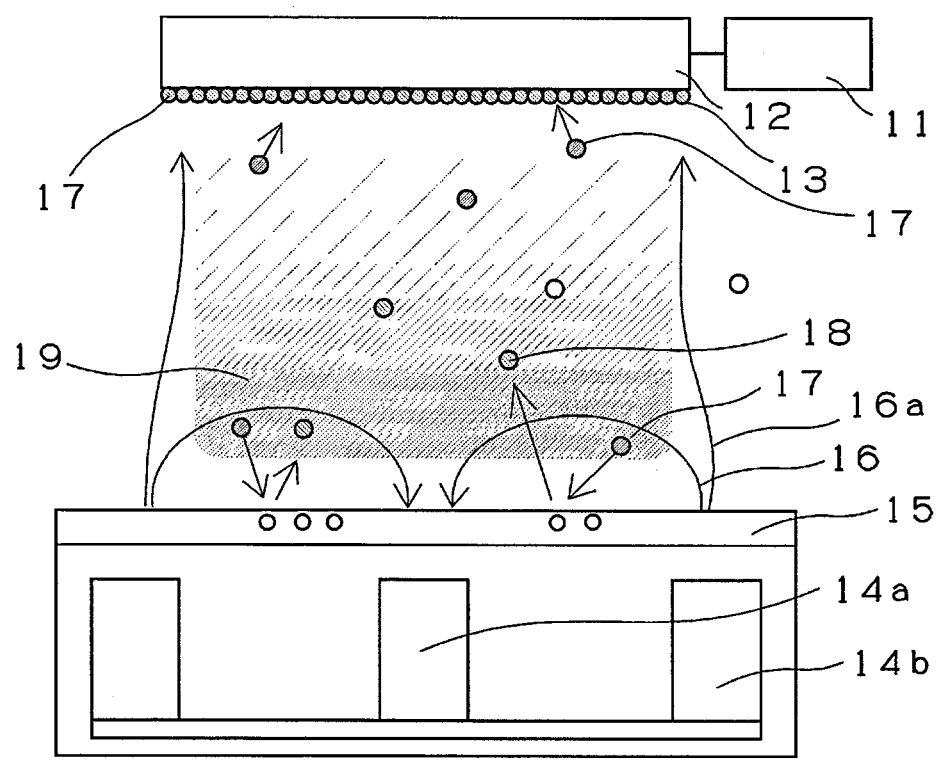
FIG. 6 is a pattern diagram showing a film-forming principle of a UBMS method.

It is preferable to form the foundation layer 8a and the mixed layer 8b by using a UBMS apparatus using Ar gas as a sputtering gas. The film formation principle of a UBMS method for which the UBMS apparatus is used is described below by a pattern diagram shown in FIG. 6. In FIG. 6, a base material 12 is a bearing member on which the hard film is to be formed. The base material is illustratively shown as a flat plate. As shown in FIG. 6, the UBMS apparatus has an inner magnet 14a and an outer magnet 14b having magnetic properties different in the central portion of a round target 15 and the peripheral portion thereof. While a high-density plasma 19 is being formed in the neighborhood of the target 15, a part 16a of magnetic field lines 16 generated by the magnets 14a and 14b diffuses to the neighborhood of the base material 12 connected to a bias power source 11. It is possible to obtain an effect that an Ar plasma generated at a sputtering time along the magnetic field lines 16a diffuses to the neighborhood of the base material 12. In the UBMS method, a dense film (layer) 13 can be formed owing to an ion assist effect that Ar ions and electrons allow more ionized target 18 to reach the base material 12 along the magnetic field lines 16a which diffuse to the neighborhood of the base material 12 more than normal sputtering methods.

In forming the foundation layer 8a, a Cr target is used as the target 15. In forming the mixed layer 8b, a WC target and a graphite target are used in combination as the target 15. In forming each of the layers, targets to be used therefor are sequentially replaced with each other.

The mixed layer 8b is formed while a sputtering electric power to be applied to the graphite target serving as a carbon supply source is being continuously or stepwise raised and while an electric power to be applied to the WC target is being continuously or stepwise lowered. Thereby the mixed layer 8b is allowed to have the gradient composition in which the content rate of the WC becomes continuously or stepwise lower and the content rate of the DLC becomes continuously or stepwise higher toward the surface layer 8c.

It is preferable to form the surface layer 8c by using the UBMS apparatus using the Ar gas as the sputtering gas. More specifically it is preferable to form the surface layer 8c by utilizing the UBMS apparatus and using the graphite target and the hydrocarbon-based gas in combination as the carbon supply source and depositing carbon atoms generated by the carbon supply source on the mixed layer 8b in conditions in which the rate of the introduction amount of the hydrocarbon-based gas to 100 which is the introduction amount of the Ar gas into the UBMS apparatus is set to 1 to 5, a vacuum degree inside the UBMS apparatus is set to 0.2 to 0.8 Pa, and the bias voltage to be applied to the bearing member which is the base material is set to 70 to 150V. These preferable conditions are described below.

By using the graphite target and the hydrocarbon-based gas in combination as the carbon supply source, it is possible to improve the adhesiveness between the surface layer 8c and the mixed layer 8b. As the hydrocarbon-based gas, it is possible to use methane gas, acetylene gas, and benzene. Although the hydrocarbon-based gas is not limited to a specific one, the methane gas is preferable from the standpoint of cost and handleability.

By setting the rate of the introduction amount of the hydrocarbon-based gas to 1 to 5 (part by volume) for 100 (part by volume) which is the introduction amount of the Ar gas into the UBMS apparatus (into film-forming chamber), it is possible to improve the adhesiveness between the surface layer 8c and the mixed layer 8b without deteriorating the wear resistance of the surface layer 8c.

As described above, the vacuum degree inside the UBMS apparatus (inside the film-forming chamber) is favorably 0.2 to 0.8 Pa and more favorably 0.25 to 0.8 Pa. When the vacuum degree inside the UBMS apparatus is less than 0.2 Pa, the amount of the Ar gas inside the chamber is small. In this case, there is a case in which the Ar gas is not generated and thus the film cannot be formed. When the vacuum degree inside the UBMS apparatus is more than 0.8 Pa, there is a fear that a reverse sputtering phenomenon is liable to occur and thus the wear resistance of the formed film deteriorates.

As described above, the bias voltage to be applied to the bearing member which is the base material is favorably 70 to 150V and more favorably 100 to 150V. When the bias voltage to be applied to the bearing member is less than 70V, densification does not progress and thus the wear resistance of the formed film deteriorates extremely, which is unpreferable. When the bias voltage to be applied to the bearing member is more than 150V, the reverse sputtering phenomenon is liable to occur, and thus there is a fear that the wear resistance of the formed film deteriorates. When the bias voltage to be applied thereto is too high, the surface layer 8c becomes so hard that the surface layer 8c may be liable to peel off the mixed layer 8b when the bearing is in operation.

The introduction amount of the Ar gas serving as the sputtering gas is favorably 40 to 150 ml/minute and more favorably 50 to 150 ml/minute. When the flow rate of the Ar gas is less than 40 ml/minute, there is a case in which the Ar plasma is not generated and the film cannot be formed. When the flow rate of the Ar gas is more than 150 ml/minute, the reverse sputtering phenomenon is liable to occur, and thus there is a fear that the wear resistance of the formed film deteriorates. When the introduction amount of the Ar gas is large, there is an increase in the probability of collision between Ar atoms and carbon atoms inside the film-forming chamber. As a result, there is a decrease in the number of the Ar atoms which reach the upper surface of the film, with the result that the effect of hardening the film by means of the Ar atoms deteriorates, and thus the wear resistance of the formed film deteriorates.

As described above, the gradient layer part 8d of the surface layer 8c is obtained by forming a film while the bias voltage to be applied to the bearing member which is the base material is being increased continuously or stepwise.

As the grease 7 for the rolling bearing 1 of the present invention, known grease for the rolling bearing can be used. When the rolling bearing 1 is operated in a high-temperature environment and a vacuum environment, it is preferable to pack fluorine grease therein.

The fluorine grease is composed of fluorine-based oil such as PFPE oil serving as its base oil and fluororesin powders serving as its thickener. As the PFPE oil, it is possible to use any compounds in which hydrogen atoms of aliphatic hydrocarbon-polyether are substituted with fluorine atoms. Compounds in which the hydrogen atoms are completely substituted with the fluorine atoms are preferable because these compounds are excellent in resistance to heat and oxidation-caused deterioration thereof. It is possible to use both straight-chain PFPE oil and PFPE oil having side chains. It is possible to use the fluorine-based oil serving as the base oil of the fluorine grease singly or as a mixture of not less than two kinds thereof. Further it is possible to use mixtures of the fluorine-based oil and oil other than the fluorine-based oil and mixtures of the fluorine grease and other grease (urea grease or the like).

As the fluororesin powder serving as the thickener of the fluorine grease, it is possible to use powders which have a high affinity for the fluorine-based oil such as the PFPE oil, high-temperature stability, and chemical resistance. As fluororesin, perfluoro-based fluororesin such as polytetrafluoroethylene (PTFE) resin, a tetrafluoroethylene-perfluoroalkylvinyl ether copolymer (PFA), and a tetrafluoroethylene-hexafluoropropylene copolymer (FEP) are listed. Of these fluororesins, the PTFE resin is preferable because it is excellent in its high-temperature stability and chemical resistance. These thickeners can be used singly or as a mixture of not less than two kinds thereof.

As the composition of the base grease of the fluorine grease, it is preferable to set the content rate of the fluorine-based oil to 50 to 90 wt % and that of the fluororesin powder to 50 to 10 wt %. By setting the content rate of each of these two substances to this range, it is possible to adjust the worked penetration of grease to a preferable one at which the leak amount thereof is small and the torque can be decreased for a long time by packing the grease in the bearing.

The grease is capable of containing known additives as necessary. As additives, an antioxidant such as organic zinc compounds and amine-based compounds; a metal deactivator such as benzotriazole; a viscosity index improver such as polymethacrylate and polystyrene; a solid lubricant such as molybdenum disulfide and graphite; a rust proof agent such as metal sulfonate and polyalcohol ester; a friction reducing agent such as organic molybdenum; an oily agent such as ester and alcohol; an anti-wear agent such as phosphorus-based compounds are listed. These additives can be added to the base oil singly or in combination of not less than two kinds thereof.

By forming the hard film having the above-described structure and properties on the rolling bearing of the present invention, even though the rolling bearing receives a load such as rolling contact and a load such as a thermal shock owing to heat generated by a local sliding when the rolling bearing is in operation, the hard film can be prevented from wearing and peeling off the base material and the raceway and the like are damaged little even in a strict lubricating state. Thus the rolling bearing has a long life. In the case where a newly-formed surface is exposed owing to damage of the bearing ring, a catalytic action accelerates the deterioration of the grease. But the hard film prevents metals from contacting each other and thus the raceway and the rolling contact surface from being damaged, thereby preventing the grease from deteriorating.

In the case where the fluorine grease is used by packing it in the rolling bearing, the hard film restrains a reaction from occurring between fluorine and steel and is thus capable of preventing the base oil from being decomposed and the steel from being worn. Therefore it is possible to utilize the intrinsic heat resistance and lubricating property of the fluorinated oil such as the PFPE oil. Thus the fluorine grease has a long life, even though it is used at a high temperature. Consequently the rolling bearing of the present invention is suitable for use in a high-temperature environment and a vacuum environment and preferably utilizable as bearings for use in the engine room of a car, bearings for use in a toner-fixing part of a copying machine, a printer, and the like, and as bearings for use in vacuum equipments.

As jigs, instruments, and parts (hereinafter referred to as "dimension-measuring jig") to be used in measuring the dimensions, tightening torques, configurations, and the like of various mechanical parts and molding dies, various gauges such as a block gauge, a pin gauge, a dial gauge, a stopper gauge, a plug gauge, and a film gauge; a surface plate to be used when dimensions are measured by using the block gauge; model parts such as models (inner ring, outer ring, cage, and rolling element of bearing) of dimensions of product configurations and models for checking the tightening torques; and dimension-measuring instruments such as a vernier caliper, a micrometer, and the like are listed.

As one example of the model parts used to control the dimension of the mechanical parts, the plug gauge for measuring the dimension of a female screw is used. The plug gauge is fitted in a hole of the female screw to examine the dimension of the hole thereof. JIS specifies the passing-side and stopping-side screw plug gauges, having a gauge portion where a male screw corresponding to the female screw is formed, for inspecting the outer diameter, effective diameter, and pitch diameter of the female screw; and the plug gauge, having a columnar gauge corresponding to the inner diameter of the female screw, for inspecting the inner diameter of the female screw.

There is proposed an art for improving the wear resistance of the plug gauge by coating the surface thereof with a hard film of TiN, CrN or the like. But there is a large variation in the thickness of the TiN film and that of the CrN film. Thus it is difficult for these films to satisfy a high dimensional accuracy demanded for the plug gauge and substantially difficult to apply the above-described art to the plug gauge. In addition, because the TiN film and the CrN film are formed by carrying out an AIP (arc ion plating) method, coarse particles (generated at arc discharge portion) called droplets attach thereto. Therefore the surface roughness of the TiN film and that of the CrN film are large, and the lubricating property thereof is impaired. Thus the art has a problem that the plug gauge is caught at the fit-in portion where the plug gauge is fitted in the female screw and thus the workability deteriorates and a problem that the wear resistance of the plug gauge is insufficient and thus the replacement interval is short.

To solve this problem, there is proposed the DLC film, having a thickness not more than 2 μm, which is formed on the surface of the plug gauge by carrying out a CVD method (Japanese Patent Application Laid-Open No. 2006-208116). There is also proposed the DLC film formed on the surface of the stopper gauge to be used to measure the dimension of the inner diameter of a hole formed through an object (Japanese Patent Application Laid-Open No. 2006-177908).

As a method of forming the DLC film, for example, there is also proposed the filtered arc method of arc ion plating capable of forming the DLC film having a small amount of irregularities on its surface by using the mechanism capable of removing particles of a negative pole material called droplets generated from the negative pole of the arc discharge portion (Japanese Patent Application Laid-Open No. 2007-046144). There is also proposed the DLC film, excellent in its adhesiveness to a base material, which is formed by carrying out the UBMS method (Japanese Patent Application Laid-Open No. 2002-256415).

But the DLC film formed by the CVD method disclosed in Japanese Patent Application Laid-Open No. 2006-208116 is inferior to the DLC film formed by the PVD method in its wear resistance and adhesiveness to the base material. Thus it cannot be said that the former DLC film is optimum as a dimension-controlling model part. In addition, according to the disclosure made in Japanese Patent Application Laid-Open No. 2006-208116, a measure such as the formation of an intermediate layer for improving the adhesiveness of the DLC film to the base material is not made.

In Japanese Patent Application Laid-Open No. 2006-177908, the DLC film is formed by using the UBMS method, and the plated layer is formed between the DLC layer and the base material. The adhesiveness between the plated layer and the base material is much inferior to that between the intermediate layer formed by the UBMS method and the base material. Therefore the adhesiveness of the entire film to the base material is insufficient. In addition, because it is difficult to adjust the thickness of the plated layer and thin the plated layer, the film disclosed in Japanese Patent Application Laid-Open No. 2006-177908 is not optimum as a model part. To enhance the adhesiveness of the film to the base material, the use of the metallic element for the intermediate layer is proposed. But in dependence on the film structure of the intermediate layer and a film-forming condition, there is a case in which the adhesiveness of the film to the base material cannot be improved.

As described above, the treatment of hard films is performed on the surface of the existing model parts to allow them to have a long life. But the hard films are insufficient in terms of their dimensional accuracy, wear resistance, and adhesiveness to the base material. Thus it is difficult to use the hard films for a long time.

In the case where the DLC film is formed on a curved portion of the surface of the dimension-measuring jig, there is a fear that in dependence on the structure of the DLC film and the film-forming condition, a residual stress inside the DLC film becomes large and that the DLC film peels off the curved portion immediately after the DLC film is formed. There is a fear that even though the DLC film does not peel off the curved portion immediately after it is formed, it peels off the curved portion when it receives a load when the dimension-measuring jig is used. Thus the DLC film is demanded to have a high adhesiveness to the base material. In the case of the model part for checking the tightening torque, to control the dimension of a housing, the model part is inserted into an object by press fit to detect a torque when the model part is reciprocatingly slid on the predetermined portion of the object. Therefore abrasion powders are liable to remain on a sliding interface, and thus the DLC film is demanded to have a high wear resistance.

In the method of forming the DLC film disclosed in Japanese Patent Application Laid-Open No. 2007-046144, priority is given to the wear resistance and thus the DLC film is inferior in its adhesiveness to the base material. Therefore it is difficult to apply the DLC film to the dimension-measuring jig. In the method of Japanese Patent Application Laid-Open No. 2002-256415, because attention is focused on the adhesiveness of the DLC film to the base material, it is difficult for the conventional film-forming condition to impart a sufficient wear resistance to the DLC film to be formed on the surface of the dimension-measuring jig.

As apparent from the foregoing description, there is a demand for the provision of a dimension-measuring jig which has the hard film excellent in its wear resistance and adhesiveness on its surface, has a long life, and is capable of greatly reducing the number of times of replacement.

To deal with the above-described problems, it is possible to form the hard film of the rolling bearing of the present invention on the surface of the base material of the dimension-measuring jig. That is, the hard film is formed on the surface of the base material of the dimension-measuring jig. The hard film has a structure composed of a foundation layer, composed mainly of Cr, which is formed directly on the surface of the base material, a mixed layer, composed mainly of WC and DLC, which is formed on the foundation layer, and a surface layer, composed mainly of the DLC, which is formed on the mixed layer. In the mixed layer, the content rate of the WC becomes lower continuously or stepwise in the direction from the side of the foundation layer toward the side of the surface layer, whereas the content rate of the DLC becomes higher continuously or stepwise in the above-described direction.

As the dimension-measuring jig, jigs, instruments, and parts to be used in measuring the dimensions, tightening torques, configurations, and the like of various mechanical parts and molding dies are listed. For example, various gauges such as a block gauge, a pin gauge, a dial gauge, a stopper gauge, a plug gauge, and a film gauge; a surface plate to be used when dimensions are measured by using the block gauge; model parts such as models (inner ring, outer ring, cage, and rolling element of bearing) of dimensions of product configurations and models for checking the tightening torques; and dimension-measuring instruments such as a vernier caliper, a micrometer, and the like are listed. There are model parts to be used when the inside diameter of the inner ring of the bearing, the outside diameter of the outer ring thereof or the dimension of the rolling element of the bearing are measured; and those to be used when the inside diameter of a housing to be used by fitting the outer ring of a spherical bearing therein is measured.

Although the base material of the dimension-measuring jig is not limited to a particular one, it is possible to use a cemented carbide material or the iron-based material. As the cemented carbide material, in addition to a WC—Co based alloy excellent in its mechanical property, a WC—TiC—Co based alloy, a WC—TaC—Co based alloy, and a WC—TiC—TaC—Co based alloy all of which are improved in the oxidation resistance thereof are listed as a cutting tool. As the iron-based material, carbon tool steel, high-speed tool steel, alloy tool steel, stainless steel, bearing steel, and free-cutting steel are listed.

It is preferable that the hardness of the surface of each of these base materials on which the hard film is to be formed is not less than 650 in Vickers hardness Hv. By setting the Vickers hardness Hv of the surface of each of the base materials to not less than 650, it is possible to decrease the difference between the hardness of the surface of each of the base materials and that of the hard film (foundation layer) and improve the adhesiveness therebetween.

It is preferable to form the nitrided layer by performing the nitriding treatment on the surface of the base material on which the hard film is to be formed before the hard film is formed thereon. As the nitriding treatment, it is preferable to subject the surface of the base material to the plasma nitriding treatment because the plasma nitriding treatment makes it difficult for the oxidized layer which prevents the adhesiveness between the hard film and the surface of the base material to be formed. It is preferable that the hardness of the surface of the base material of the bearing member subjected to the nitriding treatment is not less than 1000 in the Vickers hardness Hv to further improve the adhesiveness between the hard film (foundation layer) and the surface of each of the bearing members.

It is preferable that the surface roughness Ra of the surface of the base material on which the hard film is to be formed is not more than 0.05 μm. When the surface roughness Ra exceeds 0.05 μm, it is difficult to form the hard film on the upper ends of the projections of the irregularities of surface of the base material, and thus the thickness of the formed hard film is locally small.

The structure and properties of the hard film to be formed on the surface of the base material of the dimension-measuring jig and the method of forming the hard film on the surface of the base material thereof are identical to those of the hard film to be formed on the rolling bearing.

EXAMPLES

Formation of Film on Inner and Outer Rings

As the hard film to be formed on the rolling bearing of the present invention, the hard films were formed on predetermined base materials to evaluate the properties of the hard films. Similar hard films were formed on the raceway of inner and outer rings of rolling bearings to evaluate the properties of the rolling bearings.

The base materials used to evaluate the hard films, the UBMS apparatus, the sputtering gas, and the film-forming condition of the foundation layer and that of the mixed layer are as described below.

(1) Base material: base materials shown in each table (2) Dimension of base material: disk ($\phi$48 mm×$\phi$8 mm×7 mm) having a mirror surface (Ra: about 0.005 μm)

(3) UBMS apparatus: UBMS202/AIP composite apparatus produced by Kobe Steel, Ltd.

(4) Sputtering gas: Ar gas (5) Film-forming condition of foundation layer and that of mixed layer:

Foundation layer: The inside of a film-forming chamber was vacuumed to about $5\times10^{-3}$ Pa, and the base materials were baked by a heater. After the surfaces of the base materials were etched by means of an Ar plasma, a Cr layer was formed thereon by carrying out the UBMS method and by using a Cr target. In forming the foundation layer of a substance other than Cr, films were formed in the same condition as the condition in which the foundation layer was formed of the Cr layer except that a target corresponding to the substance other than the Cr was used.

Mixed layer: The inside of the film-forming chamber was vacuumed to about $5\times10^{-3}$ Pa, and the base materials were baked by the heater. After the surfaces of the base materials (or the surface of Cr layer) were etched by means of the Ar plasma, the sputtering electric power to be applied to the WC target and that to be applied to the graphite target were adjusted to allow the composition ratio between the WC and the DLC to have a gradient. In forming the mixed layer of the DLC and a substance other than the WC, films were formed in the same condition as the condition in which the mixed layer was formed of the WC and the DLC except that a target corresponding to the substance other than the WC was used.

(6) The condition of forming the film of the surface layer is shown in tables.

Figure 7:
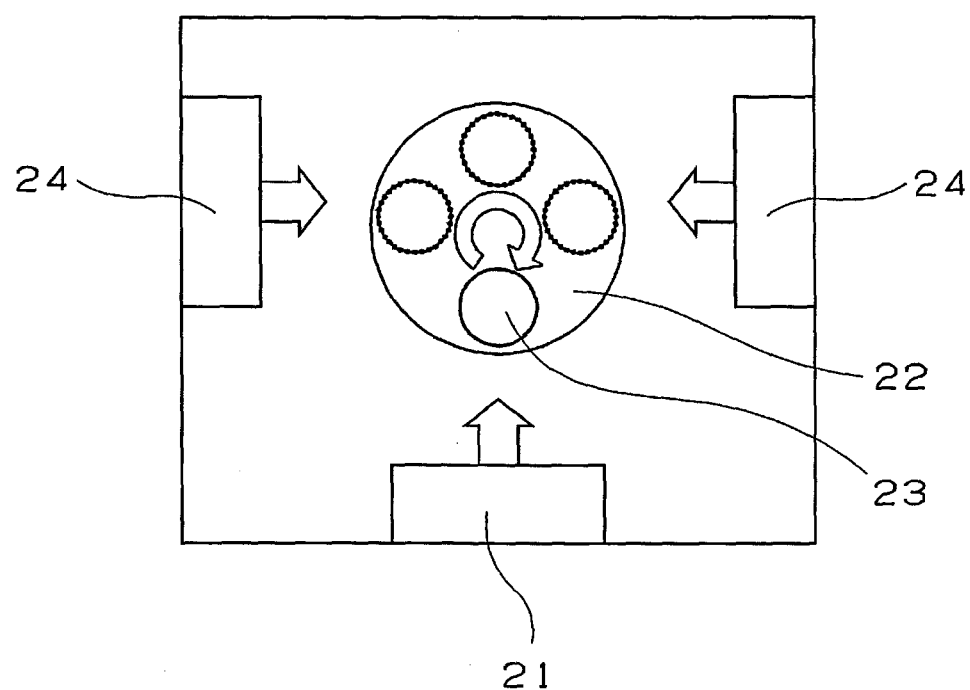
FIG. 7 is a pattern diagram of a UBMS apparatus having an AIP function.

FIG. 7 shows the outline of the UBMS202/AIP composite apparatus. FIG. 7 is a pattern diagram of the UBMS apparatus having an arc ion plating (hereinafter referred to as AIP) function. As shown in FIG. 7, the UBMS202/AIP composite apparatus has the AIP function of forming a film by instantaneously vaporizing and ionizing an AIP vaporization source material 21 by utilizing a vacuum arc discharge and depositing the vaporized and ionized AIP vaporization source material 21 on a base material 23 disposed on a disk 22 and has a UBMS function capable of controlling the property of a film deposited on the base material by increasing a plasma density in the neighborhood of the base material 23 to increase an ion assist effect, with a sputtering vaporization source material (target) 24 being subjected to an unbalanced magnetic field. This apparatus is capable of forming a composite film composed of an AIP film and a plurality of UBMS films (containing gradient composition) combined arbitrarily with each other on the base material. In this example, the foundation layer, the mixed layer, and the surface layer are formed as the UBMS film on the bearing member which is the base material. The raceway of the outer ring is positioned on the inner circumference of the outer ring. The UBMS film is formed on the raceway of the outer ring by means of the ionized target which is sputtered around the raceway of the outer ring.

Examples 1-1 Through 1-8, 1-10, Comparative Examples 1-1 Through 1-5, and Reference Examples 1-1 Through 1-8

After the base materials shown in tables 1 through 3 were ultrasonically cleaned with acetone, the base materials were dried. After they were dried, they were mounted on the UBMS/AIP composite apparatus to form the foundation layer and the mixed layer both made of the materials shown in tables 1 through 3 in the above-described film-forming condition. The DLC film which is the surface layer was formed on the mixed layer in the film-forming conditions shown in tables 1 through 3 to obtain specimens each having a hard film. "Vacuum degree" shown in tables 1 through 3 means a vacuum degree inside the film-forming chamber of the above-described apparatus. The obtained specimens were subjected to a wear test, a hardness test, a film thickness test, a scratch test, and a thrust type rolling fatigue test. Results are shown in each of tables 1 through 3. Reference numerals 1) through 5) shown below table 1 apply to tables 2 and 3.

Example 1-9

After a base material (Vickers hardness Hv: 1000) subjected to the plasma nitrogen treatment by using a radical nitriding apparatus produced by Japan Electronics Industry Co., Ltd was ultrasonically cleaned with acetone, the base material was dried. After the base material was dried, it was mounted on the UBMS/AIP composite apparatus to form the foundation layer (Cr) and the mixed layer (WC/DLC) both made of the material shown in table 1 in the above-described film-forming condition. The DLC film which was the surface layer was formed on the mixed layer in the film-forming condition shown in table 1 to obtain a specimen having a hard film. The obtained specimen was subjected to tests similar to those of the example 1-1. Results are shown in table 1.

<Friction Test>

Figure 8:
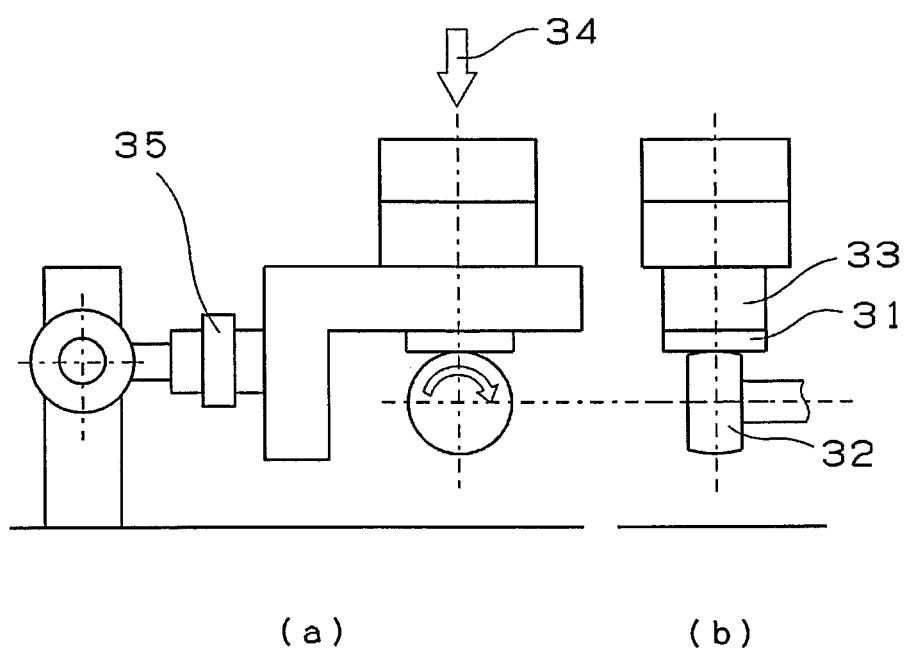
FIG. 8 shows a friction testing machine.

A friction test was conducted on the obtained specimens by using a friction testing machine shown in FIG. 8. FIGS. 8(*a*) and 8(*b*) show a front view and a side view respectively. A mating material 32 consisting of a quenched steel of SUJ2 having a surface roughness Ra not more than 0.01 μm and Vickers hardness Hv of 780 was mounted on a rotational shaft. The mating material 32 was rotated at a rotational speed of 0.05 m/s for 30 minutes without interposing a lubricant between the specimen 31 and the mating material 32 in conditions in which a Hertzian maximum contact surface pressure was 0.5 GPa and a room temperature was 25° C. with a predetermined load 34 being applied to the specimen 31 fixed to an arm portion 33 from above in FIG. 8. A frictional force generated between the specimen 31 and the mating material 32 was detected by a load cell. The specific wear amount of each specimen was computed from the obtained frictional force.

<Hardness Test>

The indentation hardness of each of the obtained specimens was measured by using a nano indenter (G200) produced by Agilent Technologies, Inc. Each of the measured values shows the average value of depths (positions where hardness was uniform) not influenced by the surface roughness. The depth of each specimen was measured at 10 positions.

<Film Thickness Test>

The film thickness of each of the obtained specimens was measured by using a surface configuration roughness measuring instrument (Form•Talysurf PG1830 produced by Taylor Hobson Ltd.). To determine the film thickness of each specimen, a film-formed portion was partly masked, and the difference in level between a film-unformed portion and the film-formed portion was computed.

<Scratch Test>

A scratch test was conducted on each of the obtained specimens by using a Revetest RST produced by Nanotech Co., Ltd. to measure the critical peeling load of each specimen. More specifically, the test was conducted on each of the obtained specimens by using a diamond indenter having a radius of 200 μm at its tip at a scratch speed of 10 mm/minute and a load application speed of 10N/mm (load was successively increased). Determination was made on the screen of a testing machine: a load at which an exposed area of the base material reached 50% of a friction trace (length in friction direction: 375 μm, width: about 100 μm) on the screen was measured as the critical peeling load of each specimen.

<Thrust Type Rolling Fatigue Test>

Figure 9:
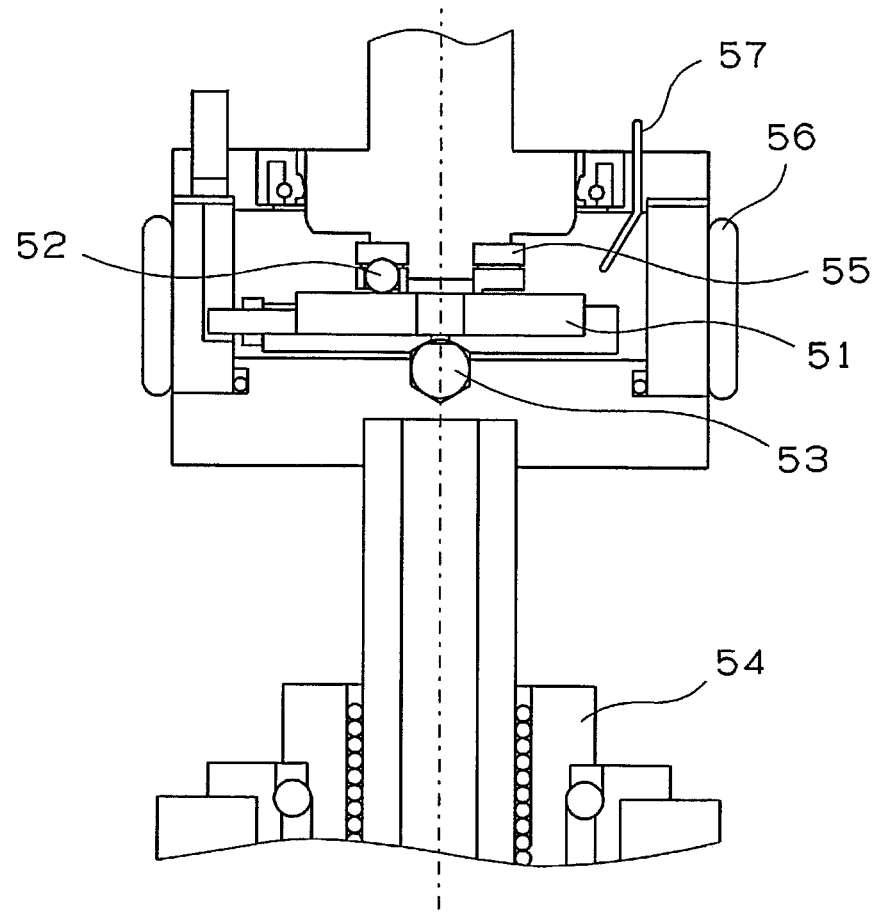
FIG. 9 shows a machine to be used in a thrust type rolling fatigue test.

A thrust type rolling fatigue test was conducted on each of the obtained specimens by using a testing machine shown in FIG. 9. The test was conducted in two different conditions of a "low lambda condition" in which a bearing was lubricated in a severe condition and a "high lambda condition" in which the bearing was lubricated in a favorable condition to evaluate the rolling fatigue property of each hard film. In the "low lambda condition", boundary lubrication takes place. Thus in addition to a pure repeated rolling fatigue, contact-caused damage has an influence on the rolling fatigue property of each hard film. Therefore the wear resistance of the hard film and the adhesiveness thereof to the base material are demanded. The contents of the "low lambda condition" and those of the "high lambda condition" are shown below.

[Low Lambda Condition]
  Lubricating oil: VG2
  Lambda: 0.6
  Maximum contact surface pressure: 2 GPa
  Number of rotations: 1000 r/minute
  Raceway diameter: φ20 mm
  Rolling element: size: 7/32", number of pieces: three, material: SUJ2, hardness Hv: 750, and surface roughness: 0.005 μmRa
  Temperature of oil: 70° C.
  Cutoff time: not set
  (number of load-applied times: eighth power in 1111 hours)

[High Lambda Condition]
  Lubricating oil: VG32
  Lambda: 9.5
  Maximum contact surface pressure: 3 GPa
  Number of rotations: 4500 r/minute
  Raceway diameter: φ20 mm
  Rolling element: 7/32", number of pieces: three, material: SUJ2, hardness Hv: 750, and surface roughness: 0.005 μmRa
  Temperature of oil: 70° C.
  Cutoff time: 300 hours
  (number of load-applied times: eighth power in 247 hours)

As shown in FIG. 9, the testing machine is so constructed that a rolling element 52 rolls between a disk-shaped specimen 51 and a bearing washer 55 and that the specimen 51 is supported via an aligning ball 53. In FIG. 9, a reference numeral 54 denotes a rotary ball spline for precompression, a reference numeral 56 denotes a heater, and a reference numeral 57 denotes a thermocouple. The testing machine is so constructed that the trace of rolling does not misalign, when the specimen 51 is re-mounted on the aligning ball 53. In the evaluation method, each specimen is removed therefrom at an interval of 20 hours which is the predetermined test period of time to check whether hard films have peeled from the specimen by means of optical microscopic observation. For example, when a hard film has peeled from the specimen in the checking at the elapse of 20 hours, the life length thereof is 20 hours. When a hard film has not peeled therefrom in the checking at the elapse of 20 hours, the specimen is re-mounted on the aligning ball 53 to continue the test. The life lengths of the hard films are shown in tables 1 and 2. As the determination criterion of the life length of each hard film in the low lambda condition, hard films having a life length not less than 1500 hours are recorded as "○", those having a life length not less than 1000 hours and less than 1500 hours are recorded as "Δ", and those having a life length less than 1000 hours are recorded as "x". As the determination criterion of the life length of each hard film in the high lambda condition, those having a life length not less than 300 hours are recorded as "○", whereas those having a life length less than 300 hours are recorded as "x".

<Test of Formation of Film on Inner and Outer Rings of Bearing>

Figure 12:
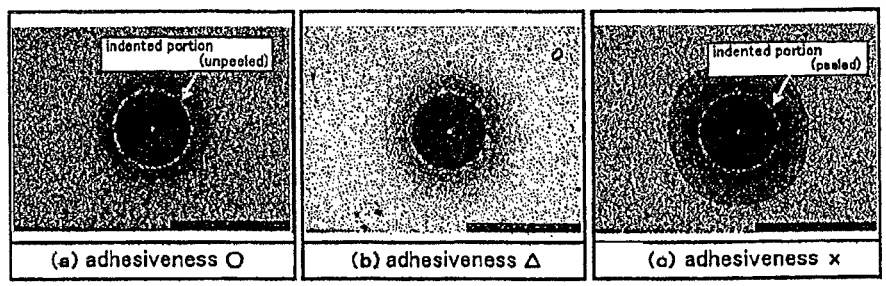
FIG. 12 shows a criterion in evaluating adhesives.

Hard films were formed on raceway of inner and outer rings of a 6206 rolling bearing (deep groove ball bearing) shown below in the conditions (other than base material) of the examples, the comparative examples, the reference examples. Whether the hard films peeled off the bearing members immediately after the hard films were formed on the raceway of inner and outer rings was checked. Specimens in which the hard films did not peel off the bearing members when they were taken out of the film-forming chamber were recorded as "○", whereas specimens in which the hard films peeled off the bearing members when they were taken out of the film-forming chamber were recorded as "x". Tables show the results. A photograph taken after the test of the example 1-1 finished is shown in FIG. 12. A photograph taken after the test of the comparative example 1-1 finished is shown in FIG. 13. A photograph taken after the test of the comparative example 1-4 finished is shown in FIG. 14.

Inner ring: A hard film was formed on its raceway. Material: SUJ2, hardness Hv: 750, surface roughness: 0.03 μmRa
  Outer ring: A hard film was formed on its raceway. Material: SUJ2, hardness Hv: 750, surface roughness: 0.03 μmRa <Test of Bearing Life Length>

Figure 10:
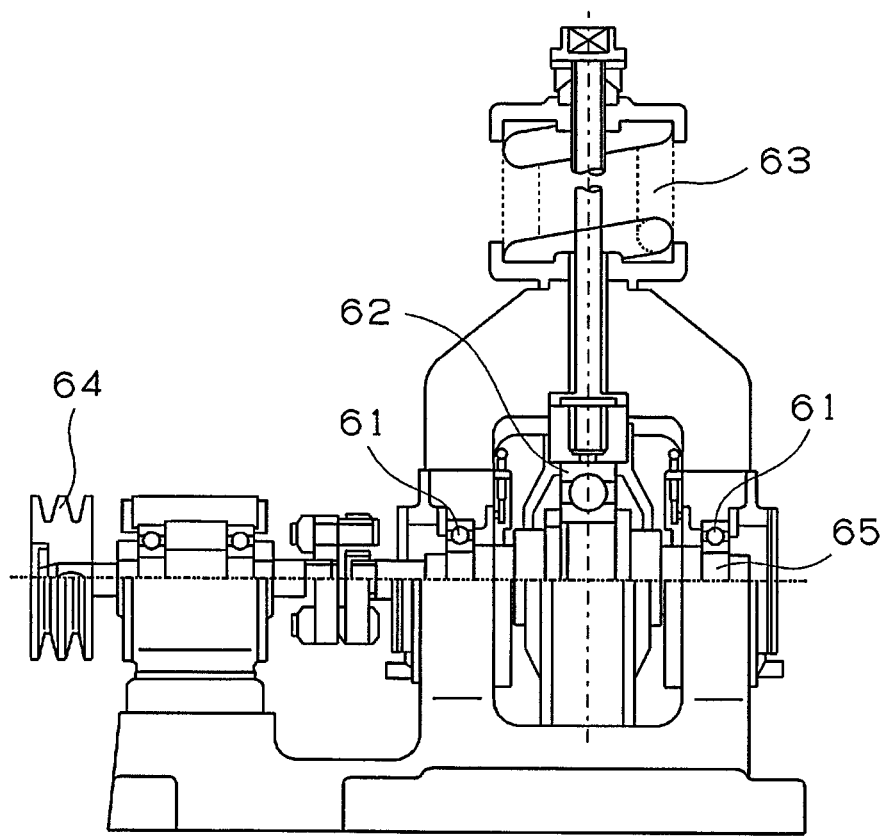
FIG. 10 shows a testing machine used in a bearing life test.

By using the inner and outer rings on which the hard film was formed in the above-described film-forming test, the 6206 rolling bearings (deep groove ball bearings) for the test were assembled. A life length test was conducted on the test bearing by using a testing machine shown in FIG. 10. As shown in FIG. 10, the testing machine is so constructed that a shaft 65 to be rotated by a driving pulley 64 is supported by a pair of test bearings 61 with a load being applied to the shaft 65 from a load-applying coil spring 63 via a load-applying ball bearing 62. The lubrication state is supposed to be favorable. Test conditions are shown below.

Inner and outer rings: Inner and outer rings on which the hard film was formed in the above-described film-forming test.
  Rolling element: size: 3/8", number of pieces: 9, material: SUJ2, hardness Hv: 750, surface roughness: 0.005 μmRa
  Lubricating oil: VG56
  Lambda: not less than three
  Maximum contact surface pressure: 3.3 GPa
  Number of rotations: 3000 r/minute (rotation of inner ring)
  Computed life length: $L_{10}$ life 127 hours
  Cutoff time: 200 hours A test of a 20-hour test period of time and a test of a 200-hour test period of time were conducted. By optical microscopic observation, each of the raceway was checked as to whether the hard films peeled from each bearing member. For example, when a hard film peeled therefrom in the checking at the elapse of the 20-hour test period of time, the life length thereof is 20 hours. When a hard film peeled therefrom in the checking at the elapse of the 200-hour test period of time, the life length thereof is 200 hours. Thus 20 hours, 200 hours, and not less than 200 hours are the levels of the life length. The life lengths of the hard films are shown in tables 1 and 2. As the determination criterion of the life length of each hard film, hard films having a life length not less than 200 hours are recorded as "○" and those having a life length less than 200 hours are recorded as "x". Tables 1 and 2 show the results.

TABLE 1

|  | Example | | | | |
|---|---|---|---|---|---|
|  | 1-1 | 1-2 | 1-3 | 1-4 | 1-5 |
| Base material[1] | SUJ2 | SUJ2 | SUJ3 | SUJ4 | SUJ5 |
| Hardness Hv of base material | 780 | 780 | 780 | 780 | 780 |
| Surface roughness μmRa of base material | 0.005 | 0.005 | 0.005 | 0.005 | 0.005 |
| Whether surface treatment was made ("○": treated, "—": not treated) | — | — | — | — | — |
| Hardness Hv of nitrided layer | — | — | — | — | — |
| Material of foundation layer | Cr | Cr | Cr | Cr | Cr |
| Material[2] (used in combination with DLC) of | WC | WC | WC | WC | WC |
| Whether gradient portion[3] was formed ("○": formed, "—": not formed) | ○ | ○ | ○ | ○ | ○ |
| Film-forming condition of surface layer |  |  |  |  |  |
| Introduction ratio of methane gas[4] | 3.0 | 1.0 | 5.0 | 1.5 | 1.0 |
| Vacuum degree (Pa) | 0.25 | 0.25 | 0.25 | 0.45 | 0.80 |
| Bias voltage (negative) applied to base material (V) | 100 | 100 | 100 | 150 | 100 |
| Specific wear amount (×10$^{-10}$ mm$^3$/(N/m)) | 100 | 80 | 145 | 135 | 120 |
| Indentation hardness |  |  |  |  |  |
| Average value (GPa) | 29.7 | 36.4 | 26.4 | 27.7 | 26.1 |
| Standard deviation (GPa) | 5.0 | 6.3 | 4.9 | 3.4 | 3.0 |
| Average value + standard deviation (GPa) | 34.7 | 42.7 | 31.3 | 31.1 | 29.1 |
| Critical peeling load (N) | 74 | 74 | 75 | 75 | 73 |
| Film thickness (μm) | 1.4 | 1.2 | 1.4 | 1.2 | 1.2 |
| Ratio[5] of thickness of surface layer to that of hard film | 0.70 | 0.70 | 0.74 | 0.70 | 0.70 |
| Thrust test in low lambda condition |  |  |  |  |  |
| Life length (hour) of hard film before peeling occurred | 2200 | 2200 | 1980 | 1980 | 2200 |
| Determination of life length | ○ | ○ | ○ | ○ | ○ |
| Thrust test in high lambda condition |  |  |  |  |  |
| Life length (hour) of hard film before peeling occurred | not less than 300 | not less than 300 | not less than 300 | not less than 300 | not less than 300 |
| Determination of life length | ○ | ○ | ○ | ○ | ○ |
| Test of 6206 bearing |  |  |  |  |  |
| Film-formed state of inner and outer rings | ○ | ○ | ○ | ○ | ○ |
| Life length (hour) of hard film before peeling occurred | not less than 200 | not less than 200 | not less than 200 | not less than 200 | not less than 200 |
| Determination of life length | ○ | ○ | ○ | ○ | ○ |

|  | Example | | | | |
|---|---|---|---|---|---|
|  | 1-6 | 1-7 | 1-8 | 1-9 | 1-10 |
| Base material[1] | SUS | S53C | SUJ2 | SUS | SUJ2 |
| Hardness Hv of base material | 650 | 650 | 780 | 650 | 780 |
| Surface roughness μmRa of base material | 0.005 | 0.005 | 0.045 | 0.005 | 0.005 |
| Whether surface treatment was made ("○": treated, "—": not treated) | — | — | — | ○ | — |
| Hardness Hv of nitrided layer | — | — | — | 1000 | — |
| Material of foundation layer | Cr | Cr | Cr | Cr | Cr |
| Material[2] (used in combination with DLC) of | WC | WC | WC | WC | WC |
| Whether gradient portion[3] was formed ("○": formed, "—": not formed) | ○ | ○ | ○ | ○ | ○ |
| Film-forming condition of surface layer |  |  |  |  |  |
| Introduction ratio of methane gas[4] | 3.0 | 3.0 | 3.0 | 3.0 | 3.0 |
| Vacuum degree (Pa) | 0.25 | 0.25 | 0.25 | 0.25 | 0.25 |
| Bias voltage (negative) applied to base material (V) | 100 | 100 | 100 | 100 | 100 |
| Specific wear amount (×10$^{-10}$ mm$^3$/(N/m)) | 100 | 100 | 100 | 100 | 135 |
| Indentation hardness |  |  |  |  |  |
| Average value (GPa) | 29.5 | 29.5 | 28.5 | 29.8 | 26.4 |
| Standard deviation (GPa) | 5.2 | 5.3 | 4.5 | 5.1 | 2.0 |
| Average value + standard deviation (GPa) | 34.7 | 34.8 | 33.0 | 34.9 | 28.4 |
| Critical peeling load (N) | 68 | 68 | 66 | 76 | 71 |

TABLE 1-continued

| | | | | | |
|---|---|---|---|---|---|
| Film thickness (μm) | 1.4 | 1.4 | 1.4 | 1.4 | 2.8 |
| Ratio[5] of thickness of surface layer to that of hard film | 0.70 | 0.70 | 0.70 | 0.70 | 0.70 |
| Thrust test in low lambda condition | | | | | |
| Life length (hour) of hard film before peeling occurred | 2200 | 2200 | 1980 | 2200 | 3080 |
| Determination of life length | ○ | ○ | ○ | ○ | ○ |
| Thrust test in high lambda condition | | | | | |
| Life length (hour) of hard film before peeling occurred | not less than 300 | not less than 300 | not less than 300 | not less than 300 | not less than 300 |
| Determination of life length | ○ | ○ | ○ | ○ | ○ |
| Test of 6206 bearing | | | | | |
| Film-formed state of inner and outer rings | ○ | ○ | ○ | ○ | ○ |
| Life length (hour) of hard film before peeling occurred | not less than 200 | not less than 200 | not less than 200 | not less than 200 | not less than 200 |
| Determination of life length | ○ | ○ | ○ | ○ | ○ |

[1] SUJ2 to 5:SUJ2 to 5, SUS:SUS440C, S53C:S53C
[2] shows mixed layer in which DLC was used in combination. In the case of "WC", mixed layer consisted of WC/DLC. "—" means that mixed layer was not formed.
[3] shows DLC gradient part in surface layer.
[4] "—" means that only Ar gas was used. Introduction ratio of methane gas shows ratio of introduction amount of methane gas to 100 which was introduction amount of Ar gas.
[5] Film thickness of surface layer with respect to entire film thickness

TABLE 2

| | Comparative example | | | | |
|---|---|---|---|---|---|
| | 1-1 | 1-2 | 1-3 | 1-4 | 1-5 |
| Base material[1] | SUJ2 | SUJ2 | SUJ2 | SUJ2 | SUJ2 |
| Hardness Hv of base material | 780 | 780 | 780 | 780 | 780 |
| Surface roughness μmRa of base material | 0.005 | 0.005 | 0.005 | 0.005 | 0.005 |
| Whether surface treatment was made ("○": treated, "—": not treated) | — | — | — | — | — |
| Hardness Hv of nitrided layer | — | — | — | — | — |
| Material of foundation layer | — | Cr | W | Ti | Cr |
| Material[2] (used in combination with DLC) of mixed layer | WC | — | WC | WC | Cr |
| Whether gradient portion[3] was formed ("○": formed, "—": not formed) | ○ | ○ | ○ | ○ | ○ |
| Film-forming condition of surface layer | | | | | |
| Introduction ratio of methane gas[4] | 3.0 | 1.0 | 3.0 | 3.0 | 3.0 |
| Vacuum degree (Pa) | 0.25 | 0.80 | 0.25 | 0.25 | 0.25 |
| Bias voltage (negative) applied to base material (V) | 100 | 100 | 100 | 100 | 100 |
| Specific wear amount ($\times 10^{-10}$ mm$^3$/(N/m)) | 100 | 6) | 100 | 100 | 120 |
| Indentation hardness | | | | | |
| Average value (GPa) | 29.1 | 26.1 | 29.0 | 29.4 | 29.0 |
| Standard deviation (GPa) | 5.0 | 3.1 | 5.5 | 4.9 | 5.1 |
| Average value + standard deviation (GPa) | 34.1 | 29.2 | 34.5 | 34.3 | 34.1 |
| Critical peeling load (N) | 71 | 25 | 63 | 63 | 71 |
| Film thickness (μm) | 2.1 | 1.8 | 2.6 | 2.2 | 2.9 |
| Ratio[5] of thickness of surface layer to that of hard film | 0.72 | 0.78 | 0.70 | 0.71 | 0.72 |
| Thrust test in low lambda condition | | | | | |
| Life length (hour) of hard film before peeling occurred | 2200 | 220 | 660 | 880 | 1980 |
| Determination of life length | ○ | X | X | X | ○ |
| Thrust test in high lambda condition | | | | | |
| Life length (hour) of hard film before peeling occurred | not less than 300 | 60 | not less than 300 | not less than 300 | not less than 300 |
| Determination of life length | ○ | X | ○ | ○ | ○ |
| Test of 6206 bearing | | | | | |
| Film-formed state of inner and outer rings | X | X | X | X | ○ |

TABLE 2-continued

|  | Comparative example | | | | |
|---|---|---|---|---|---|
|  | 1-1 | 1-2 | 1-3 | 1-4 | 1-5 |
| Life length (hour) of hard film before peeling occurred | — | — | — | — | 20 |
| Determination of life length | — | — | — | — | X |

6) Because peeling occurred during test, specific wear amount was unmeasurable.

TABLE 3

|  | Reference example | | | |
|---|---|---|---|---|
|  | 1-1 | 1-2 | 1-3 | 1-4 |
| Base material[1] | SUJ2 | SUJ2 | SUJ2 | SUJ2 |
| Hardness Hv of base material | 210 | 780 | 780 | 780 |
| Surface roughness μmRa of base material | 0.005 | 0.091 | 0.005 | 0.005 |
| Whether surface treatment was made ("○": treated, "—": not treated) | — | — | — | — |
| Hardness Hv of nitrided layer | — | — | — | — |
| Material of foundation layer | Cr | Cr | Cr | Cr |
| Material[2] (used in combination with DLC) of mixed layer | WC | WC | WC | WC |
| Whether gradient portion[3] was formed ("○": formed, "—": not formed) | ○ | ○ | ○ | ○ |
| Film-forming condition of surface layer | | | | |
| Introduction ratio of methane gas[4] | 3.0 | 3.0 | — | 10.0 |
| Vacuum degree (Pa) | 0.25 | 0.25 | 0.80 | 0.50 |
| Bias voltage (negative) applied to base material (V) | 100 | 100 | 100 | 100 |
| Specific wear amount ($\times 10^{-10}$ mm$^3$/(N/m)) | 100 | 100 | 250 | 300 |
| Indentation hardness | | | | |
| Average value (GPa) | 27.0 | 26.8 | 19.0 | 22.0 |
| Standard deviation (GPa) | 3.5 | 7.9 | 2.0 | 1.5 |
| Average value + standard deviation (GPa) | 30.5 | 34.7 | 21.0 | 23.5 |
| Critical peeling load (N) | 30 | 66 | 66 | 75 |
| Film thickness (μm) | 1.4 | 2.1 | 2.8 | 2.4 |
| Ratio[5] of thickness of surface layer to that of hard film | 0.70 | 0.70 | 0.71 | 0.74 |
| Thrust test in low lambda condition | | | | |
| Life length (hour) of hard film before peeling occurred | 220 | 1320 | 660 | 440 |
| Determination of life length | X | Δ | X | X |
| Thrust test in high lambda condition | | | | |
| Life length (hour) of hard film before peeling occurred | 20 | not less than 300 | not less than 300 | not less than 300 |
| Determination of life length | X | ○ | ○ | ○ |
| Test of 6206 bearing | | | | |
| Film-formed state of inner and outer rings | ○ | ○ | ○ | ○ |

|  | Reference example | | | |
|---|---|---|---|---|
|  | 1-5 | 1-6 | 1-7 | 1-8 |
| Base material[1] | SUJ2 | SUJ2 | SUJ2 | SUJ2 |
| Hardness Hv of base material | 780 | 780 | 780 | 780 |
| Surface roughness μmRa of base material | 0.005 | 0.005 | 0.005 | 0.005 |
| Whether surface treatment was made ("○": treated, "—": not treated) | — | — | — | — |
| Hardness Hv of nitrided layer | — | — | — | — |
| Material of foundation layer | Cr | Cr | Cr | Cr |
| Material[2] (used in combination with DLC) of mixed layer | WC | WC | WC | WC |
| Whether gradient portion[3] was formed ("○": formed, "—": not formed) | ○ | ○ | ○ | ○ |
| Film-forming condition of surface layer | | | | |
| Introduction ratio of methane gas[4] | 3.0 | 3.0 | 3.0 | 3.0 |
| Vacuum degree (Pa) | 0.14 | 1.05 | 0.25 | 0.2;normal5 |

TABLE 3-continued

| | | | | |
|---|---|---|---|---|
| Bias voltage (negative) applied to base material (V) | 100 | 100 | 50 | 200 |
| Specific wear amount (×10⁻¹⁰ mm³/(N/m)) | 7) | 220 | 250 | 80 |
| Indentation hardness | | | | |
| Average value (GPa) | 7) | 16.0 | 20.0 | 35.0 |
| Standard deviation (GPa) | 7) | 1.0 | 3.0 | 2.0 |
| Average value + standard deviation (GPa) | 7) | 17.0 | 23.0 | 37.0 |
| Critical peeling load (N) | 7) | 72 | 71 | 61 |
| Film thickness (μm) | 7) | 1.5 | 2.4 | 1.2 |
| Ratio⁵⁾ of thickness of surface layer to that of hard film | 7) | 0.71 | 0.71 | 0.71 |
| Thrust test in low lambda condition | | | | |
| Life length (hour) of hard film before peeling occurred | 7) | 660 | 880 | 2200 |
| Determination of life length | 7) | X | X | ○ |
| Thrust test in high lambda condition | | | | |
| Life length (hour) of hard film before peeling occurred | 7) | not less than 300 | not less than 300 | not less than 300 |
| Determination of life length | 7) | ○ | ○ | ○ |
| Test of 6206 bearing | | | | |
| Film-formed state of inner and outer rings | 7) | ○ | ○ | ○ |

7) Because peeling occurred during test, specific wear amount was unmeasurable.

As shown in table 1, the hard film of each example is excellent in its wear resistance and adhesiveness to the base material and thus peeling of the hard film therefrom could be prevented when the bearing was operated.

In the specimens of the examples having the predetermined membrane structure, the films were formed on the raceway of the inner and outer rings in a favorable state. On the other hand, in the specimens of the comparative examples 1-1 through 1-4 in which the structures of the foundation and intermediate layers were different from those of the foundation and intermediate layers of the present invention, it was difficult to form films. For example, in the example 1-1 the hard film was favorably formed. On the other hand, in the comparative example 1-1 in which the foundation layer was not formed, the film greatly peeled off the base material, and in the comparative example 1-4 in which the foundation layer was formed but consisted not of Cr but of Ti, the film also peeled off the base material. In the comparative example 1-5, the film could be formed, but was liable to easily peel off the base material when the bearing was operated.

[Formation of Film on Cage]

As the hard film to be formed on the cage of the rolling bearing of present invention, hard films were formed on predetermined base materials respectively to evaluate the properties thereof. In addition, similar hard films were formed on sliding contact surfaces of cages of rolling bearings to evaluate the properties of the bearings.

The base materials used to evaluate the hard films are as shown in the tables. The dimensions of the base materials, the UBMS apparatus, the sputtering gas, and the film-forming condition of the foundation layer and that of the mixed layer are the same as those used in the case of the above-described "formation of film on inner and outer rings".

Examples 2-1 Through 2-9, Example 2-11, Comparative Examples 2-1 Through 2-7, and Reference Examples 2-1 Through 2-7

After the base materials shown in tables 4 through 6 were ultrasonically cleaned with acetone, the base materials were dried. After the base materials were dried, they were mounted on the UBMS/AIP composite apparatus to form the foundation layer and the mixed layer both made of the materials shown in tables 1 through 3 in the above-described film-forming condition. The DLC film was formed on each mixed layer which was the surface layer in the film-forming conditions shown in tables 1 through 3. Thereby specimens each having the hard film were obtained. "Vacuum degree" shown in the tables means a vacuum degree inside the film-forming chamber of the above-described apparatus. The obtained specimens were subjected to the wear test, the hardness test, the film thickness test, and the scratch test similar to those conducted in the case of the above-described "formation of film on inner and outer rings". Results are shown in each of tables 4 through 6. Reference numerals 1) through 4) shown below table 4 apply to tables 5 and 6.

Example 2-10

After base material (Vickers hardness Hv: 1000) subjected to the plasma nitrogen treatment by using the radical nitriding apparatus produced by Japan Electronics Industry Co., Ltd was ultrasonically cleaned with acetone, the base material was dried. After the base material was dried, it was mounted on the UBMS/AIP composite apparatus to form the foundation layer (Cr) and the mixed layer (WC/DLC) both made of the materials shown in table 4 in the above-described film-forming condition. The DLC film was formed on the mixed layer which was the surface layer in the film-forming conditions shown in table 4. Thereby a specimen having the hard film was obtained. The obtained specimen was subjected to a test similar to the test conducted in the example 2-1. Results are shown in table 4.

<Test of Formation of Film on Cage for Bearing>

Hard films were formed on the sliding contact surface (pocket surfaces) of a cage of a 6204 rolling bearing (deep groove ball bearing) shown below in conditions of the examples, the comparative examples, the reference examples. Whether the hard films peeled off the cage immediately after the hard films were formed on the sliding contact surface of the cage was checked. Specimens in which the hard films did not peel off the cage when they were taken out of the film-forming chamber were recorded as "○", whereas specimens in which the hard films peeled off the cage when they were taken out of the film-forming chamber were recorded as "x". Tables show the results.

Cage: cages each consisting of two separate iron plates (hard film was formed on sliding contact surface of each cage on which rolling elements slide. A base material (material, hardness, surface roughness) of each cage is as shown in table 1).

<Test of Life Length of Bearing>

Figure 11:
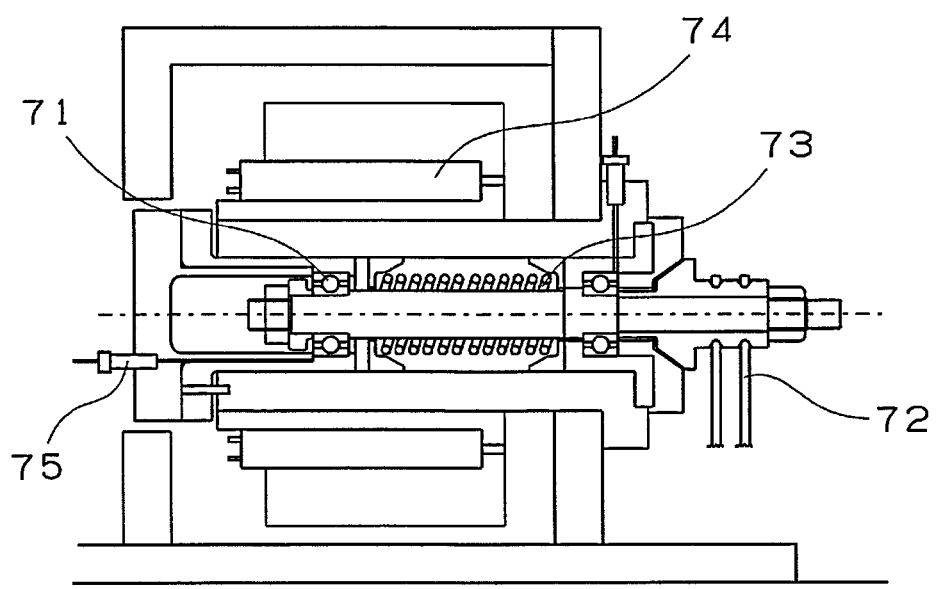
FIG. 11 shows the testing machine used in the bearing life test.

By using the cages on which the hard films were formed in the above-described film-forming test, the 6204 rolling bearings (deep groove ball bearing) for the test were assembled. A life length test was conducted on the test bearings by using a testing machine shown in FIG. 11. As shown in FIG. 11, the testing machine is so constructed that a shaft to be rotated by a pulley 72 is supported by a test bearing 71 with a load being applied to the shaft from a load-applying coil spring 73. The reference numeral 74 denotes a cartridge heater, and the reference numeral 75 denotes a thermocouple. The test conditions are shown below.

Cage: cages each consisting of two separate iron plates (hard film was formed on sliding contact surface of each cage on which rolling elements slide. A base material (material, hardness, surface roughness) of each cage is as shown in tables)

Test bearing: 6204 (rubber seal)

Lubrication: lithium ester-based grease (viscosity of base oil at 40° C.: 26 mm$^2$/second, worked penetration: 260)

Packed amount: 15% (volume ratio to entire space)

Load: radial load: 67N, axial load: 67N

Number of rotations: 10000 r/minute (rotation of inner ring)

Temperature: 150° C.

When seizing has occurred on the cage, the cage has reached the end of its life. When the cage has reached the end of its life, the torque rises rapidly. In this test, a period of time (hour) until before the testing machine stops owing to an overload is set as the life length. Tables show the results.

TABLE 4

|  | Example | | | | | |
|---|---|---|---|---|---|---|
|  | 2-1 | 2-2 | 2-3 | 2-4 | 2-5 | 2-6 |
| Base material | SPCC | SPCC | SPCC | SPCC | SPCC | SUS304 |
| Hardness Hv of base material | 190 | 190 | 190 | 190 | 190 | 200 |
| Surface roughness μmRa of base material | 0.24 | 0.24 | 0.24 | 0.24 | 0.24 | 0.31 |
| Whether surface treatment was made ("○": treated, "—": not treated) | — | — | — | — | — | — |
| Hardness Hv of nitrided layer | — | — | — | — | — | — |
| Material of foundation layer | Cr | Cr | Cr | Cr | Cr | Cr |
| Material[1] (used in combination with DLC) of mixed layer | WC | WC | WC | WC | WC | WC |
| Whether gradient portion[2] was formed ("○": formed, "—": not formed) | ○ | ○ | ○ | ○ | ○ | ○ |
| Film-forming condition of surface layer | | | | | | |
| Introduction ratio of methane gas[3] | 3.0 | 1.0 | 5.0 | 1.5 | 1.0 | 3.0 |
| Vacuum degree (Pa) | 0.25 | 0.25 | 0.25 | 0.45 | 0.80 | 0.25 |
| Bias voltage (negative) applied to base material (V) | 100 | 100 | 100 | 150 | 100 | 100 |
| Specific wear amount (×10$^{-10}$ mm$^3$/(N/m)) | 100 | 80 | 145 | 135 | 120 | 100 |
| Indentation hardness | | | | | | |
| Average value (GPa) | 29.5 | 36.4 | 26.4 | 27.7 | 26.1 | 27.0 |
| Standard deviation (GPa) | 5.2 | 6.3 | 4.9 | 3.4 | 3.0 | 3.5 |
| Average value + standard deviation (GPa) | 34.7 | 42.7 | 31.3 | 31.1 | 29.1 | 30.5 |
| Critical peeling load (N) | 68 | 68 | 69 | 69 | 67 | 30 |
| Film thickness (μm) | 1.4 | 1.2 | 1.4 | 1.2 | 1.2 | 1.4 |
| Ratio[4] of thickness of surface layer to that of hard film | 0.70 | 0.70 | 0.74 | 0.70 | 0.70 | 0.70 |
| Test of 6204 bearing | | | | | | |
| Film-formed state of cage | ○ | ○ | ○ | ○ | ○ | ○ |
| Life length before seizing (average value N = 5) occurred, hour | 288 | 281 | 240 | 242 | 300 | 290 |

|  | Example | | | | |
|---|---|---|---|---|---|
|  | 2-7 | 2-8 | 2-9 | 2-10 | 2-11 |
| Base material | SPCC | SCM420 | SPCC | SPCC | SPCC |
| Hardness Hv of base material | 540 | 750 | 190 | 540 | 190 |
| Surface roughness μmRa of base material | 0.18 | 0.21 | 0.45 | 0.18 | 0.24 |
| Whether surface treatment was made ("○": treated, "—": not treated) | — | — | — | ○ | — |
| Hardness Hv of nitrided layer | — | — | — | 1000 | — |
| Material of foundation layer | Cr | Cr | Cr | Cr | Cr |
| Material[1] (used in combination with DLC) of mixed layer | WC | WC | WC | WC | WC |
| Whether gradient portion[2] was formed ("○": formed, "—": not formed) | ○ | ○ | ○ | ○ | ○ |

TABLE 4-continued

| Film-forming condition of surface layer | | | | | |
|---|---|---|---|---|---|
| Introduction ratio of methane gas[3] | 3.0 | 3.0 | 3.0 | 3.0 | 3.0 |
| Vacuum degree (Pa) | 0.25 | 0.25 | 0.25 | 0.25 | 0.25 |
| Bias voltage (negative) applied to base material (V) | 100 | 100 | 100 | 100 | 100 |
| Specific wear amount ($\times 10^{-10}$ mm$^3$/(N/m)) | 100 | 100 | 100 | 100 | 135 |
| Indentation hardness | | | | | |
| Average value (GPa) | 29.7 | 29.5 | 28.5 | 29.8 | 26.4 |
| Standard deviation (GPa) | 5.0 | 5.3 | 4.5 | 5.1 | 2.0 |
| Average value + standard deviation (GPa) | 34.7 | 34.8 | 33.0 | 34.9 | 28.4 |
| Critical peeling load (N) | 70 | 68 | 60 | 70 | 65 |
| Film thickness (μm) | 1.4 | 1.4 | 1.4 | 1.4 | 2.8 |
| Ratio[4] of thickness of surface layer to that of hard film | 0.70 | 0.70 | 0.70 | 0.70 | 0.70 |
| Test of 6204 bearing | | | | | |
| Film-formed state of cage | ○ | ○ | ○ | ○ | ○ |
| Life length before seizing (average value N = 5) occurred, hour | 306 | 360 | 241 | 372 | 490 |

[1] mixed layer in which DLC was used in combination. In the case "WC", mixed layer consisted of WC/DLC. "—" means that mixed layer was not formed.
[2] DLC gradient part in surface layer.
[3] "—" means that only Ar gas was used. Introduction ratio of methane gas shows ratio of introduction amount of methane gas to 100 which was introduction amount of Ar gas.
[4] Film thickness of surface layer with respect to entire film thickness

TABLE 5

| | Comparative example | | | | | | |
|---|---|---|---|---|---|---|---|
| | 2-1 | 2-2 | 2-3 | 2-4 | 2-5 | 2-6 | 2-7 |
| Base material | SPCC | CAC301 | SPCC | SPCC | SPCC | SUS304 | SPCC |
| Hardness Hv of base material | 190 | 160 | 190 | 190 | 190 | 190 | 190 |
| Surface roughness μmRa of base material | 0.24 | 0.38 | 0.24 | 0.24 | 0.24 | 0.24 | 0.24 |
| Whether surface treatment was made ("○": treated, "—": not treated) | — | — | — | — | — | — | — |
| Hardness Hv of nitrided layer | — | — | — | — | — | — | — |
| Material of foundation layer | — | Cr | — | Cr | W | Ti | Cr |
| Material[1] (used in combination with DLC) of mixed layer | — | WC | WC | — | WC | WC | Cr |
| Whether gradient portion[2] was formed ("○": formed, "—": not formed) | — | ○ | ○ | ○ | ○ | ○ | ○ |
| Film-forming condition of surface layer | | | | | | | |
| Introduction ratio of methane gas[3] | — | 3.0 | 3.0 | 3.0 | 3.0 | 3.0 | 3.0 |
| Vacuum degree (Pa) | — | 0.25 | 0.25 | 0.25 | 0.25 | 0.25 | 0.25 |
| Bias voltage (negative) applied to base material (V) | — | 100 | 100 | 100 | 100 | 100 | 100 |
| Specific wear amount ($\times 10^{-10}$ mm$^3$/(N/m)) | — | 100 | 100 | 5) | 100 | 100 | 120 |
| Indentation hardness | | | | | | | |
| Average value (GPa) | — | 27.0 | 29.1 | 29.9 | 29.0 | 29.4 | 29.0 |
| Standard deviation (GPa) | — | 3.5 | 5.0 | 4.5 | 5.5 | 4.9 | 5.1 |
| Average value + standard deviation (GPa) | — | 30.5 | 34.1 | 34.4 | 34.5 | 34.3 | 34.1 |
| Critical peeling load (N) | — | 30 | 65 | 28 | 60 | 63 | 65 |
| Film thickness (μm) | — | 1.4 | 2.1 | 1.8 | 2.6 | 2.2 | 2.9 |
| Ratio[4] of thickness of surface layer to that of hard film | — | 0.70 | 0.72 | 0.78 | 0.70 | 0.71 | 0.72 |
| Test of 6204 bearing | | | | | | | |
| Film-formed state of cage | — | X | X | X | X | X | ○ |
| Life length before seizing (average value N = 5) occurred, hour | 150 | — | — | — | — | — | 192 |

5) Because peeling occurred during test, specific wear amount was unmeasurable.

TABLE 6

| | Reference example | | | | | | |
|---|---|---|---|---|---|---|---|
| | 2-1 | 2-2 | 2-3 | 2-4 | 2-5 | 2-6 | 2-7 |
| Base material | SPCC | SPCC | SPCC | SPCC | SPCC | SPCC | SPCC |
| Hardness Hv of base material | 190 | 190 | 190 | 190 | 190 | 190 | 190 |

TABLE 6-continued

|  | Reference example | | | | | | |
| --- | --- | --- | --- | --- | --- | --- | --- |
|  | 2-1 | 2-2 | 2-3 | 2-4 | 2-5 | 2-6 | 2-7 |
| Surface roughness μmRa of base material | 0.91 | 0.24 | 0.24 | 0.24 | 0.24 | 0.24 | 0.24 |
| Whether surface treatment was made ("○": treated, "—": not treated) | — | — | — | — | — | — | — |
| Hardness Hv of nitrided layer | — | — | — | — | — | — | — |
| Material of foundation layer | Cr | Cr | Cr | Cr | Cr | Cr | Cr |
| Material[1] (used in combination with DLC) of mixed layer | WC | WC | WC | WC | WC | WC | WC |
| Whether gradient portion[2] was formed ("○": formed, "—": not formed) | ○ | ○ | ○ | ○ | ○ | ○ | ○ |
| Film-forming condition of surface layer |  |  |  |  |  |  |  |
| Introduction ratio of methane gas[3] | 3.0 | — | 10.0 | 3.0 | 3.0 | 3.0 | 3.0 |
| Vacuum degree (Pa) | 0.25 | 0.80 | 0.50 | 0.14 | 1.05 | 0.25 | 0.25 |
| Bias voltage (negative) applied to base material (V) | 100 | 100 | 100 | 100 | 100 | 50 | 200 |
| Specific wear amount ($\times 10^{-10}$ mm$^3$/(N/m)) | 100 | 250 | 300 | 6) | 220 | 250 | 80 |
| Indentation hardness |  |  |  |  |  |  |  |
| Average value (GPa) | 26.8 | 19.0 | 22.0 | 6) | 16.0 | 20.0 | 35.0 |
| Standard deviation (GPa) | 7.9 | 2.0 | 1.5 | 6) | 1.0 | 3.0 | 2.0 |
| Average value + standard deviation (GPa) | 34.7 | 21.0 | 23.5 | 6) | 17.0 | 23.0 | 37.0 |
| Critical peeling load (N) | 60 | 60 | 69 | 6) | 66 | 65 | 55 |
| Film thickness (μm) | 2.1 | 2.8 | 2.4 | 6) | 1.5 | 2.4 | 1.2 |
| Ratio[4] of thickness of surface layer to that of hard film | 0.70 | 0.71 | 0.74 | 6) | 0.71 | 0.71 | 0.71 |
| Test of 6204 bearing |  |  |  |  |  |  |  |
| Film-formed state of cage | ○ | ○ | ○ | 6) | ○ | ○ | ○ |

6) Because discharge did not occur, film could not be formed.

As shown in table 4, the hard film of each example is excellent in its wear resistance and adhesiveness to the cage and thus peeling of the hard film therefrom could be prevented when the bearing was operated.

[Formation of Film on Inner and Outer Rings and Cage (Influence of Fluorine Grease is Included)]

As the hard film to be formed on the rolling bearing of present invention, hard films were formed on predetermined base materials respectively to evaluate the properties thereof. In addition, similar hard films were formed on inner and outer rings of rolling bearings and the pocket surfaces of cages thereof to evaluate the properties of the rolling bearings.

Base materials used to evaluate the hard films are those of "inner and outer rings" shown in the tables. The dimensions of the base materials, the DBMS apparatus, the sputtering gas, and the film-forming condition of the foundation layer and that of the mixed layer are the same as those used in the case of the above-described "formation of film on inner and outer rings".

Examples 3-1 Through 3-9, 3-11, 3-12, Comparative Examples 3-2 Through 3-6, and Reference Examples 3-1 Through 3-8

After the base materials of the inner and outer rings shown in tables 7 through 9 were ultrasonically cleaned with acetone, the base materials were dried. After the base materials were dried, they were mounted on the UBMS/AIP composite apparatus to form the foundation layer and the mixed layer both made of the materials shown in tables 7 through 9 in the above-described film-forming condition. The DLC film was formed on each mixed layer which was the surface layer in the film-forming conditions shown in tables 7 through 9. Thereby specimens each having a hard film were obtained. "Vacuum degree" shown in each table means a vacuum degree inside the film-forming chamber of the above-described apparatus. The obtained specimens were subjected to the wear test, the hardness test, the film thickness test, and the scratch test similar to those conducted in the case of the above-described "formation of film on inner and outer rings" conducted. Results are shown in the tables. The reference numerals 1) through 6) shown below table 7 apply to tables 8 and 9.

Example 3-10

After a base material (Vickers hardness Hv: 1000) subjected to the plasma nitrogen treatment by using the radical nitriding apparatus produced by Japan Electronics Industry Co., Ltd was ultrasonically cleaned with acetone, the base material was dried. After the base material was dried, it was mounted on the UBMS/AIP composite apparatus to form the foundation layer (Cr) and the mixed layer (WC/DLC) both made of the materials shown in table 7 in the above-described film-forming condition. The DLC film was formed on the mixed layer which was the surface layer in the film-forming conditions shown in table 7. Thereby specimen having the hard film was obtained. The obtained specimen was subjected to the test similar to that of the example 3-1. Results are shown in table 7.

<Test of Formation of Film on Bearing Member>

Hard films were formed on portions, (inner ring, outer ring, and pocket surface of cage (cage consisting of two separate iron plates)) of the 6204 rolling bearings (deep groove ball bearings) shown in tables, on which the hard films were to be formed in the conditions of the examples, the comparative examples, and the reference examples. Whether the hard films peeled off the above-described portions immediately after they were formed thereon was checked. In each of the examples, the comparative examples, and the reference examples, the film-forming conditions of the inner ring, the outer ring, and the cage are the same except film-forming condition of the base material. In each of the inner ring, the outer ring, and the cage, specimens in which the hard films did not peel off the portions on which the hard films were formed when they were taken out of the film-forming chamber were recorded as "○", whereas specimens in which the hard films peeled off any one of inner ring, the outer ring, and the cage when the hard films were taken out of the film-forming chamber were recorded as "x". Tables show the results.

The inner and outer rings and the cage in which the hard film could be favorably formed on the portions, shown in tables, where the hard films were to be formed in the film formation test were incorporated in each of test 6204 rolling bearings (deep groove ball bearings). Fluorine grease was packed in each test rolling bearing. A life length test was conducted on the test bearings by using the testing machine shown in FIG. 11. A similar test was conducted on the specimen of the comparative example 3-1 in which the hard film was not formed. Test conditions are shown below.

Inner ring/outer ring/cage: as shown in tables.
Test bearing: 6204 (rubber seal)
Lubrication: fluorine grease (NOXLUB KF1920 produced by NOK Cluver Inc.)
Packed amount: 5% (volume ratio to entire space)
Load: radial load: 67N, axial load: 67N
Number of rotations: 10000 r/minute (rotation of inner ring)
Temperature: 200° C.

When seizing has occurred on the cage, the cage has reached the end of its life. When the cage has reached the end of its life, the torque rises rapidly. In this test, a period of time (hour) until before the testing machine stops owing to an overload is set as the life length. Tables show the results.

TABLE 7

|  | Example | | | | | |
|---|---|---|---|---|---|---|
|  | 3-1 | 3-2 | 3-3 | 3-4 | 3-5 | 3-6 |
| Film-formed portion[1] | inner, outer, C | inner, outer, C | inner, outer, C | inner, outer, C | inner, outer, C | inner, outer, C |
| Inner and outer rings | | | | | | |
| Material | SUS440C | SUS440C | SUS440C | SUS440C | SUS440C | SUJ2 |
| Hardness (Hv) | 650 | 650 | 650 | 650 | 650 | 780 |
| Surface roughness (μmRa) | 0.005 | 0.005 | 0.005 | 0.005 | 0.005 | 0.005 |
| Whether surface treatment was made ("○": treated, "—": not treated) | — | — | — | — | — | — |
| Hardness of nitrided layer (Hv) | — | — | — | — | — | — |
| Cage | | | | | | |
| Material | SUS304 | SUS304 | SUS304 | SUS304 | SUS304 | SPCC |
| Hardness (Hv) | 200 | 200 | 200 | 200 | 200 | 190 |
| Surface roughness (μmRa) | 0.31 | 0.31 | 0.31 | 0.31 | 0.31 | 0.24 |
| Whether surface treatment was made ("○": treated, "—": not treated) | — | — | — | — | — | — |
| Hardness of nitrided layer (Hv) | — | — | — | — | — | — |
| Material of foundation layer[2] | Cr | Cr | Cr | Cr | Cr | Cr |
| Material of mixed layer[3] | WC | WC | WC | WC | WC | WC |
| Whether gradient portion[4] was formed ("○": formed, "—": not formed) | ○ | ○ | ○ | ○ | ○ | ○ |
| Film-forming condition of surface layer | | | | | | |
| Introduction ratio[5] of methane gas | 3.0 | 1.0 | 5.0 | 1.5 | 1.0 | 3.0 |
| Vacuum degree (Pa) | 0.25 | 0.25 | 0.25 | 0.45 | 0.80 | 0.25 |
| Bias voltage (negative) (V) | 100 | 100 | 100 | 150 | 100 | 100 |
| Specific wear amount ($\times 10^{-10}$ mm$^3$/(N/m)) | 100 | 80 | 145 | 135 | 120 | 100 |
| Indentation hardness | | | | | | |
| Average value (GPa) | 29.5 | 36.4 | 26.4 | 27.7 | 26.1 | 27.0 |
| Standard deviation (GPa) | 5.2 | 6.3 | 4.9 | 3.4 | 3.0 | 3.5 |
| Average value + standard deviation (GPa) | 34.7 | 42.7 | 31.3 | 31.1 | 29.1 | 30.5 |
| Critical peeling load (N) | 68 | 68 | 69 | 69 | 67 | 30 |
| Film thickness (μm) | 1.4 | 1.2 | 1.4 | 1.2 | 1.2 | 1.4 |
| Ratio[6] of thickness of surface layer to that of hard film | 0.70 | 0.70 | 0.74 | 0.70 | 0.70 | 0.70 |
| Test of 6204 bearing | | | | | | |
| Film-formed state of cage | ○ | ○ | ○ | ○ | ○ | ○ |
| Life length before seizing (average value N = 2) occurred, hour | not less than 500 | not less than 500 | not less than 500 | not less than 500 | not less than 500 | not less than 500 |

|  | Example | | | | | |
|---|---|---|---|---|---|---|
|  | 3-7 | 3-8 | 3-9 | 3-10 | 3-11 | 3-12 |
| Film-formed portion[1] | inner, outer, C | inner, outer, C | inner, outer, C | inner, outer, C | inner, outer, C | inner, outer |
| Inner and outer rings | | | | | | |
| Material | S53C | SUJ2 | SUJ2 | SUS440C | SUS440C | SUS440C |
| Hardness (Hv) | 650 | 780 | 780 | 650 | 650 | 650 |
| Surface roughness (μmRa) | 0.005 | 0.005 | 0.045 | 0.005 | 0.005 | 0.005 |

TABLE 7-continued

| | | | | | | |
|---|---|---|---|---|---|---|
| Whether surface treatment was made ("○": treated, "—": not treated) | — | — | — | ○ | — | — |
| Hardness of nitrided layer (Hv) | — | — | — | 1000 | — | — |
| Cage | | | | | | |
| Material | SPCC | SCM420 | SPCC | SUS304 | SPCC | CAC301 |
| Hardness (Hv) | 540 | 750 | 190 | 200 | 190 | 160 |
| Surface roughness (μmRa) | 0.18 | 0.21 | 0.45 | 0.31 | 0.24 | 0.38 |
| Whether surface treatment was made ("○": treated, "—": not treated) | — | — | — | ○ | — | — |
| Hardness of nitrided layer (Hv) | — | — | — | 1000 | — | — |
| Material of foundation layer[2] | Cr | Cr | Cr | Cr | Cr | Cr |
| Material of mixed layer[3] | WC | WC | WC | WC | WC | WC |
| Whether gradient portion[4] was formed ("○": formed, "—": not formed) | ○ | ○ | ○ | ○ | ○ | ○ |
| Film-forming condition of surface layer | | | | | | |
| Introduction ratio[5] of methane gas | 3.0 | 3.0 | 3.0 | 3.0 | 3.0 | 3.0 |
| Vacuum degree (Pa) | 0.25 | 0.25 | 0.25 | 0.25 | 0.25 | 0.25 |
| Bias voltage (negative) (V) | 100 | 100 | 100 | 100 | 100 | 100 |
| Specific wear amount ($\times 10^{-10}$ mm$^3$/(N/m)) | 100 | 100 | 100 | 100 | 135 | 100 |
| Indentation hardness | | | | | | |
| Average value (GPa) | 29.7 | 29.5 | 28.5 | 29.8 | 26.4 | 28.8 |
| Standard deviation (GPa) | 5.0 | 5.3 | 4.5 | 5.1 | 2.0 | 4.9 |
| Average value + standard deviation (GPa) | 34.7 | 34.8 | 33.0 | 34.9 | 28.4 | 33.7 |
| Critical peeling load (N) | 70 | 68 | 60 | 70 | 65 | 69 |
| Film thickness (μm) | 1.4 | 1.4 | 1.4 | 1.4 | 2.8 | 1.5 |
| Ratio[6] of thickness of surface layer to that of hard film | 0.70 | 0.70 | 0.70 | 0.70 | 0.70 | 0.70 |
| Test of 6204 bearing | | | | | | |
| Film-formed state of cage | ○ | ○ | ○ | ○ | ○ | ○ |
| Life length before seizing (average value N = 2) occurred, hour | not less than 500 | not less than 500 | not less than 500 | not less than 500 | not less than 500 | not less than 500 |

[1] Inner ring is shown by "inner". Outer ring is shown by "outer". Cage is shown by "C".
[2] Layer corresponding to Cr layer. "—" shows that foundation layer was not formed.
[3] Layer corresponding to mixed layer consisting of WC and DLC. Material of "material of mixed layer" shows replacement of WC. "—" shows that mixed layer was not formed.
[4] DLC gradient part in surface layer
[5] Introduction ratio shows ratio of introduction amount of methane gas to 100 which was introduction amount of Ar gas. "—" means that only Ar gas was used.
[6] Film thickness of the surface layer with respect to entire film thickness

TABLE 8

| | Comparative example | | | | | |
|---|---|---|---|---|---|---|
| | 3-1 | 3-2 | 3-3 | 3-4 | 3-5 | 3-6 |
| Film-formed portion[1] | — | inner, outer, C | inner, outer, C | inner, outer, C | inner, outer, C | inner, outer, C |
| Inner and outer rings | | | | | | |
| Material | SUJ2 | SUS440C | SUS440C | SUS440C | SUS440C | SUS440C |
| Hardness (Hv) | 780 | 650 | 650 | 650 | 650 | 650 |
| Surface roughness (μmRa) | 0.005 | 0.005 | 0.005 | 0.005 | 0.005 | 0.005 |
| Whether surface treatment was made ("○": treated, "—": not treated) | — | — | — | — | — | — |
| Hardness of nitrided layer (Hv) | — | — | — | — | — | — |
| Cage | | | | | | |
| Material | SPCC | SUS304 | SUS304 | SUS304 | SUS304 | SUS304 |
| Hardness (Hv) | 190 | 200 | 200 | 200 | 200 | 200 |
| Surface roughness (μmRa) | 0.24 | 0.31 | 0.31 | 0.31 | 0.31 | 0.31 |
| Whether surface treatment was made ("○": treated, "—": not treated) | — | — | — | — | — | — |
| Hardness of nitrided layer (Hv) | — | — | — | — | — | — |
| Material of foundation layer[2] | — | — | Cr | W | Ti | Cr |
| Material of mixed layer[3] | — | WC | — | WC | WC | Cr |
| Whether gradient portion[4] was formed ("○": formed, "—": not formed) | — | ○ | ○ | ○ | ○ | ○ |
| Film-forming condition of surface layer | | | | | | |
| Introduction ratio[5] of methane gas | — | 3.0 | 3.0 | 3.0 | 3.0 | 3.0 |
| Vacuum degree (Pa) | — | 0.25 | 0.25 | 0.25 | 0.25 | 0.25 |
| Bias voltage (negative) (V) | — | 100 | 100 | 100 | 100 | 100 |
| Specific wear amount ($\times 10^{-10}$ mm$^3$/(N/m)) | — | 100 | 7) | 100 | 100 | 120 |

TABLE 8-continued

|  | Comparative example | | | | | |
|---|---|---|---|---|---|---|
|  | 3-1 | 3-2 | 3-3 | 3-4 | 3-5 | 3-6 |
| Indentation hardness | | | | | | |
| Average value (GPa) | — | 29.1 | 29.9 | 29.0 | 29.4 | 29.0 |
| Standard deviation (GPa) | — | 5.0 | 4.5 | 5.5 | 4.9 | 5.1 |
| Average value + standard deviation (GPa) | — | 34.1 | 34.4 | 34.5 | 34.3 | 34.1 |
| Critical peeling load (N) | — | 65 | 28 | 60 | 63 | 65 |
| Film thickness (μm) | — | 2.1 | 1.8 | 2.6 | 2.2 | 2.9 |
| Ratio[6] of thickness of surface layer to that of hard film | — | 0.72 | 0.78 | 0.70 | 0.71 | 0.72 |
| Test of 6204 bearing | | | | | | |
| Film-formed state of cage | — | X | X | X | X | ○ |
| Life length before seizing (average value N = 2) occurred, hour | 250 | — | — | — | — | 350 |

7) Because peeling occurred during test, specific wear amount was unmeasurable.

TABLE 9

|  | Reference example | | | | | | | |
|---|---|---|---|---|---|---|---|---|
|  | 3-1 | 3-2 | 3-3 | 3-4 | 3-5 | 3-6 | 3-7 | 3-8 |
| Film-formed portion[1] | inner, outer, C | inner, outer, C | inner, outer, C | inner, outer, C | inner, outer, C | inner, outer, C | inner, outer, C | inner, outer, C |
| Inner and outer rings | | | | | | | | |
| Material | SUJ2 | SUS440C | SUS440C | SUS440C | SUS440C | SUS440C | SUS440C | SUS5440C |
| Hardness (Hv) | 210 | 650 | 650 | 650 | 650 | 650 | 650 | 650 |
| Surface roughness (μmRa) | 0.005 | 0.091 | 0.005 | 0.005 | 0.005 | 0.005 | 0.005 | 0.005 |
| Whether surface treatment was made ("○": treated, "—": not treated) | — | — | — | — | — | — | — | — |
| Hardness of nitrided layer (Hv) | — | — | — | — | — | — | — | — |
| Cage | | | | | | | | |
| Material | SPCC | SUS304 | SUS304 | SUS304 | SUS304 | SUS304 | SUS304 | SUS304 |
| Hardness (Hv) | 190 | 200 | 200 | 200 | 200 | 200 | 200 | 200 |
| Surface roughness (μmRa) | 0.24 | 0.91 | 0.31 | 0.31 | 0.31 | 0.31 | 0.31 | 0.31 |
| Whether surface treatment was made ("○": treated, "—": not treated) | — | — | — | — | — | — | — | — |
| Hardness of nitrided layer (Hv) | — | — | — | — | — | — | — | — |
| Material of foundation layer[2] | Cr | Cr | Cr | Cr | Cr | Cr | Cr | Cr |
| Material of mixed layer[3] | WC | WC | WC | WC | WC | WC | WC | WC |
| Whether gradient portion[4] was formed ("○": formed, "—": not formed) | ○ | ○ | ○ | ○ | ○ | ○ | ○ | ○ |
| Film-forming condition of surface layer | | | | | | | | |
| Introduction ratio[5] of methane gas | 3.0 | 3.0 | — | 10.0 | 3.0 | 3.0 | 3.0 | 3.0 |
| Vacuum degree (Pa) | 0.25 | 0.25 | 0.80 | 0.50 | 0.14 | 1.05 | 0.25 | 0.25 |
| Bias voltage (negative) (V) | 100 | 100 | 100 | 100 | 100 | 100 | 50 | 200 |
| Specific wear amount (×10⁻¹⁰ mm³/(N/m)) | 100 | 100 | 250 | 300 | 8) | 220 | 250 | 80 |
| Indentation hardness | | | | | | | | |
| Average value (GPa) | 27.0 | 26.8 | 19.0 | 22.0 | 8) | 16.0 | 20.0 | 35.0 |
| Standard deviation (GPa) | 3.5 | 7.9 | 2.0 | 1.5 | 8) | 1.0 | 3.0 | 2.0 |
| Average value + standard deviation (GPa) | 30.5 | 34.7 | 21.0 | 23.5 | 8) | 17.0 | 23.0 | 37.0 |
| Critical peeling load (N) | 30 | 60 | 60 | 69 | 8) | 66 | 65 | 55 |
| Film thickness (μm) | 1.4 | 2.1 | 2.8 | 2.4 | 8) | 1.5 | 2.4 | 1.2 |
| Ratio[6] of thickness of surface layer to that of hard film | 0.70 | 0.70 | 0.71 | 0.74 | 8) | 0.71 | 0.71 | 0.71 |
| Test of 6204 bearing | | | | | | | | |
| Film-formed state of cage | ○ | ○ | ○ | ○ | 8) | ○ | ○ | ○ |
| Life length before seizing (average value N = 2) occurred, hour | 50 | 350 | 320 | 290 | 8) | 260 | 290 | 260 |

8) Discharge did not occur

As shown in table 7, it is understood that the hard film of each example is excellent in its wear resistance and adhesiveness to the base material. Consequently it is possible to restrain the reaction from occurring between the fluorine grease packed in the bearing and copper. Therefore the bearings showed excellent durability in a life test conducted at a high temperature (200° C.)

[Formation of Film on Dimension-Measuring Jig]

An example in which hard films similar to those to be formed on the rolling bearing of the present invention are formed on dimension-measuring jigs is shown below.

Base materials used to evaluate the hard films are those shown in the tables. The dimensions of the base materials, the UBMS apparatus, the sputtering gas, and the film-forming condition of the foundation layer and that of the mixed layer are the same as those used in the case of the above-described "formation of film on inner and outer rings".

Film Formation Examples 4-1 Through 4-8, 4-10 Through 4-22

After the base materials shown in tables 10 through 12 were ultrasonically cleaned with acetone, the base materials were dried. After the base materials were dried, they were mounted on the UBMS/AIP composite apparatus to form the foundation layer and the mixed layer both made of the materials shown in the tables in the above-described film-forming condition. The DLC film was formed on the mixed layer which was the surface layer in the film-forming conditions shown in the tables. Thereby specimens each having a hard film were obtained. "Vacuum degree" shown in the tables means a vacuum degree inside the film-forming chamber of the above-described apparatus. The obtained specimens were subjected to the wear test, the hardness test, the film thickness test, and the scratch test similar to those conducted in the case of the above-described "formation of film on inner and outer rings". The obtained specimens were also subjected to a Rockwell indentation test (other than film formation examples 4-16 through 4-22) shown below. Results are shown in tables. The reference numerals 1) through 5) shown below table 10 apply to tables 11 and 12.

Film Formation Example 4-9

After base material (Vickers hardness Hv: 1000) subjected to the plasma nitrogen treatment by using the radical nitriding apparatus produced by Japan Electronics Industry Co., Ltd was ultrasonically cleaned with acetone, the base material was dried. After the base material was dried, it was mounted on the UBMS/AIP composite apparatus to form the foundation layer (Cr) and the mixed layer (WC/DLC) both made of the materials shown in table 10 in the above-described film-forming condition. The DLC film was formed on the mixed layer which was the surface layer in the film-forming conditions shown in table 10. Thereby a specimen having the hard film was obtained. The obtained specimen was subjected to a test similar to that of the film formation example 4-1. Results are shown in table 10.

<Rockwell Indentation Test>

When a diamond indenter was stricken into base materials of specimens at a load of 150 kg, a peeling generation situation on the periphery of an indenter was observed. Based on the observed peeling generation situations, the adhesiveness of each specimen to the base material was evaluated by an evaluation criterion shown in FIG. 12. Specimens which had a small generation amount of peeling as shown in FIG. 12(a) were evaluated as excellent in the adhesiveness thereof to the base material, and they were recorded as "○". Specimens in which peeling occurred partly as shown in FIG. 12(b) were evaluated as inferior in the adhesiveness thereof to the base material, and they were recorded as "Δ". Specimens in which peeling occurred on the entire circumference of the indenter as shown in FIG. 12(c) were evaluated as significantly inferior in the adhesiveness thereof to the base material, and they were recorded as "x".

TABLE 10

| | Film formation example | | | | | |
|---|---|---|---|---|---|---|
| | 4-1 | 4-2 | 4-3 | 4-4 | 4-5 | 4-6 |
| Base material[1] | SUS | SUS | SUS | SUS | SUS | SUJ2 |
| Hardness Hv of base material | 650 | 650 | 650 | 650 | 650 | 780 |
| Surface roughness μmRa of base material | 0.005 | 0.005 | 0.005 | 0.005 | 0.005 | 0.005 |
| Whether surface treatment was made ("○": treated, "—": not treated) | — | — | — | — | — | — |
| Hardness Hv of nitrided layer | — | — | — | — | — | — |
| Material of foundation layer | Cr | Cr | Cr | Cr | Cr | Cr |
| Material[2] (used in combination with DLC) | WC | WC | WC | WC | WC | WC |
| Whether gradient portion[3] was formed ("○": formed, "—": not formed) | ○ | ○ | ○ | ○ | ○ | ○ |
| Film-forming condition of surface layer | | | | | | |
| Introduction ratio[4] of methane gas | 3.0 | 1.0 | 5.0 | 1.5 | 1.0 | 3.0 |
| Vacuum degree (Pa) | 0.25 | 0.25 | 0.25 | 0.45 | 0.80 | 0.25 |
| Bias voltage (negative) applied to base material (V) | 100 | 100 | 100 | 150 | 100 | 100 |
| Specific wear amount ($\times 10^{-10}$ mm$^3$/(N/m)) | 100 | 80 | 145 | 135 | 130 | 100 |
| Indentation hardness | | | | | | |
| Average value (GPa) | 29.5 | 36.4 | 26.4 | 27.7 | 26.7 | 29.7 |
| Standard deviation (GPa) | 5.2 | 6.3 | 4.9 | 3.4 | 3.0 | 5.0 |
| Average value + standard deviation (GPa) | 34.7 | 42.7 | 31.3 | 31.1 | 29.7 | 34.7 |
| Critical peeling load (N) | 68 | 68 | 69 | 69 | 67 | 70 |
| Rockwell indentation test | ○ | ○ | ○ | ○ | ○ | ○ |
| Film thickness (μm) | 1.4 | 1.2 | 1.4 | 1.2 | 1.2 | 1.4 |
| Ratio[5] of thickness of surface layer to that of hard film | 0.70 | 0.70 | 0.74 | 0.70 | 0.70 | 0.70 |

TABLE 10-continued

|  | Film formation example | | | | |
|---|---|---|---|---|---|
|  | 4-7 | 4-8 | 4-9 | 4-10 | 4-11 |
| Base material[1] | S53C | SUS | SUS | SUS | Ultra-hard |
| Hardness Hv of base material | 650 | 650 | 650 | 650 | 650 |
| Surface roughness μmRa of base material | 0.005 | 0.045 | 0.005 | 0.005 | 0.005 |
| Whether surface treatment was made ("○": treated, "—": not treated) | — | — | ○ | — | — |
| Hardness Hv of nitrided layer | — | — | 1000 | — | — |
| Material of foundation layer | Cr | Cr | Cr | Cr | Cr |
| Material[2] (used in combination with DLC) | WC | WC | WC | WC | WC |
| Whether gradient portion[3] was formed ("○": formed, "—": not formed) | ○ | ○ | ○ | ○ | ○ |
| Film-forming condition of surface layer | | | | | |
| Introduction ratio[4] of methane gas | 3.0 | 3.0 | 3.0 | 3.0 | 3.0 |
| Vacuum degree (Pa) | 0.25 | 0.25 | 0.25 | 0.25 | 0.25 |
| Bias voltage (negative) applied to base material (V) | 100 | 100 | 100 | 100 | 100 |
| Specific wear amount ($\times 10^{-10}$ mm$^3$/(N/m)) | 100 | 100 | 100 | 135 | 125 |
| Indentation hardness | | | | | |
| Average value (GPa) | 29.5 | 28.5 | 29.8 | 26.4 | 26.8 |
| Standard deviation (GPa) | 5.3 | 4.5 | 5.1 | 2.0 | 2.0 |
| Average value + standard deviation (GPa) | 34.8 | 33.0 | 34.9 | 28.4 | 28.8 |
| Critical peeling load (N) | 68 | 60 | 70 | 65 | 65 |
| Rockwell indentation test | ○ | ○ | ○ | ○ | ○ |
| Film thickness (μm) | 1.4 | 1.4 | 1.4 | 2.8 | 2.8 |
| Ratio[5] of thickness of surface layer to that of hard film | 0.70 | 0.70 | 0.70 | 0.70 | 0.70 |

[1] SUS, SUS440C, SUJ2: SUJ2, S53C: S53C, ultra-hard: cemented carbide
[2] mixed layer in which DLC was used in combination. In the case "WC", mixed layer consists of WC/DLC. "—" means that mixed layer was not formed.
[3] DLC gradient part in surface layer
[4] "—" means that only Ar gas was used. Introduction ratio of methane gas shows ratio of introduction amount of methane gas to 100 which was introduction amount of Ar gas.
[5] Film thickness of surface layer with respect to entire film thickness

TABLE 11

|  | Film formation example | | | |
|---|---|---|---|---|
|  | 4-12 | 4-13 | 4-14 | 4-15 |
| Base material[1] | SUS | Ultra-hard | SUS | SUS |
| Hardness Hv of base material | 650 | 650 | 650 | 650 |
| Surface roughness μmRa of base material | 0.005 | 0.005 | 0.005 | 0.005 |
| Whether surface treatment was made ("○": treated, "—": not treated) | — | — | — | — |
| Hardness Hv of nitrided layer | — | — | — | — |
| Material of foundation layer | Cr | W | Ti | Cr |
| Material[2] (used in combination with DLC) | — | WC | WC | Cr |
| Whether gradient portion[3] was formed ("○": formed, "—": not formed) | ○ | ○ | ○ | ○ |
| Film-forming condition of surface layer | | | | |
| Introduction ratio[4] of methane gas | 3.0 | 3.0 | 3.0 | 3.0 |
| Vacuum degree (Pa) | 0.25 | 0.25 | 0.25 | 0.25 |
| Bias voltage (negative) applied to base material (V) | 100 | 100 | 100 | 100 |
| Specific wear amount ($\times 10^{-10}$ mm$^3$/(N/m)) | 6) | 110 | 100 | 120 |
| Indentation hardness | | | | |
| Average value (GPa) | 29.9 | 29.4 | 29.4 | 29.0 |
| Standard deviation (GPa) | 4.5 | 5.5 | 4.9 | 5.1 |
| Average value + standard deviation (GPa) | 34.4 | 34.9 | 34.3 | 34.1 |
| Critical peeling load (N) | 28 | 60 | 50 | 65 |
| Rockwell indentation test | X | Δ | Δ | Δ |
| Film thickness (μm) | 1.8 | 2.6 | 2.2 | 2.9 |
| Ratio[5] of thickness of surface layer to that of hard film | 0.78 | 0.70 | 0.71 | 0.72 |

6) Because peeling occurred during test, specific wear amount was unmeasurable.

TABLE 12

|  | Film formation example | | | | | | |
|---|---|---|---|---|---|---|---|
|  | 4-16 | 4-17 | 4-18 | 4-19 | 4-20 | 4-21 | 4-22 |
| Base material[1] | SUJ2 | Ultra-hard | SUS | SUS | SUS | SUS | SUS |
| Hardness Hv of base material | 210 | 650 | 650 | 650 | 650 | 650 | 650 |
| Surface roughness μmRa of base material | 0.005 | 0.005 | 0.005 | 0.005 | 0.005 | 0.005 | 0.005 |

TABLE 12-continued

| | Film formation example | | | | | | |
|---|---|---|---|---|---|---|---|
| | 4-16 | 4-17 | 4-18 | 4-19 | 4-20 | 4-21 | 4-22 |
| Whether surface treatment was made ("○": treated, "—": not treated) | — | — | — | — | — | — | — |
| Hardness Hv of nitrided layer | — | — | — | — | — | — | — |
| Material of foundation layer | Cr | Cr | Cr | Cr | Cr | Cr | Cr |
| Material[2] (used in combination with DLC) | WC | WC | WC | WC | WC | WC | WC |
| Whether gradient portion[3] was formed ("○": formed, "—": not formed) | ○ | ○ | ○ | ○ | ○ | ○ | ○ |
| Film-forming condition of surface layer | | | | | | | |
| Introduction ratio[4] of methane gas | 3.0 | — | 10.0 | 3.0 | 3.0 | 3.0 | 3.0 |
| Vacuum degree (Pa) | 0.25 | 0.80 | 0.50 | 0.14 | 1.05 | 0.25 | 0.25 |
| Bias voltage (negative) applied to base material (V) | 100 | 100 | 100 | 100 | 100 | 50 | 250 |
| Specific wear amount ($\times 10^{-10}$ mm$^3$/(N/m)) | 100 | 240 | 330 | 7) | 220 | 310 | 200 |
| Indentation hardness | | | | | | | |
| Average value (GPa) | 27.0 | 19.0 | 22.0 | 7) | 16.0 | 20.0 | 31.0 |
| Standard deviation (GPa) | 3.5 | 2.0 | 1.5 | 7) | 1.0 | 3.0 | 2.0 |
| Average value + standard deviation (GPa) | 30.5 | 21.0 | 23.5 | 7) | 17.0 | 23.0 | 33.0 |
| Critical peeling load (N) | 30 | 40 | 45 | 7) | 50 | 48 | 36 |
| Film thickness (μm) | 1.4 | 2.8 | 2.4 | 7) | 1.5 | 2.4 | 1.1 |
| Ratio[5] of thickness of surface layer to that of hard film | 0.70 | 0.71 | 0.74 | 7) | 0.71 | 0.71 | 0.90 |

7) Because discharge did not occur, film could not be formed.

As shown in table 10, it is understood that the hard films of the film formation examples were excellent in the wear resistance and adhesiveness thereof to the base material. In the film formation examples 4-12 through 4-15 in which the structures of the foundation layers and the intermediate layers were different from the structures of the foundation layers and the intermediate layers of the film formation examples 4-1 through 4-11, peeling occurred in the Rockwell indentation test.

To check the durability of the dimension-measuring jig, the following tests were conducted.

<Stopper Gauge Test A>

A test of passing stopper gauges, made of SUJ2 (Vickers hardness Hv: 780), which have a dimension of φ22 mm×φ8 mm×t6 mm through a hole with φ8 was conducted. The inside diameter of each sintered metal part (copper-iron) used in the test was so adjusted as to be within φ8.01 mm±0.01 mm. The stopper gauges (φ8 mm±0.005 mm×L50 mm, Ra=0.01 μmm, roundness: 0.001 mm) surface-treated in the conditions shown in table 13 were passed through the inside diameter portion of each sintered metal part to check the inside diameter thereof. Because the stopper gauge slides on the inside diameter portion of the sintered metal part, the stopper gauge is damaged and wear with an increase in the number of pass-through times. To measure the roundness, Talyrond 365 produced by Taylor Hobson Ltd. was used. The pass-through test was conducted on 1,000,000 sintered metal parts. Stopper gauges having less than 0.002 mm (amount of change: less than 0.001 mm) in the roundness thereof were recorded as "○". Stopper gauges having 0.002 mm to 0.004 mm in the roundness thereof were recorded as "Δ.". Stopper gauges having more than 0.004 mm in the roundness thereof were recorded as "x". Table 13 shows the results.

<Stopper Gauge Test B>

A test of passing stopper gauges, made of SUJ2 (Vickers hardness Hv: 780), which have a dimension of φ50 mm×φ100 mm×t50 mm through a hole with φ50 was conducted. The inside diameter of each housing made of FC200 used in the test was so adjusted as to be within φ50 (0.000 to +0.02 mm). The stopper gauges (φ50 mm±0.002 mm×L80 mm, Ra=0.5 μmm) surface-treated in the conditions shown in table 13 were passed through the housing to check the inside diameter thereof. Because the stopper gauge slides on the inside diameter portion of the housing, the stopper gauge is damaged and wear with an increase in the number of pass-through times. The pass-through test was conducted on 100,000 houses. Stopper gauges having less than 0.002 mm (amount of change: less than 0.001 mm) in the roundness thereof were recorded as "○". Stopper gauges having 0.002 mm to 0.004 mm in the roundness thereof were recorded as "Δ". Stopper gauges having more than 0.004 mm in the roundness thereof were recorded as "x". Table 13 shows the results.

<Caliper Measuring Test>

By using a vernier caliper, made of SUS304 (Vickers hardness Hv: 780), which has an operation portion having a dimension of 0 to 150 mm (dimension-measuring flat portion of indenter: 4 mm×10 mm, surface roughness of flat portion: 0.005 μm, dimension of product is measured at this portion, and force of pressing vernier caliper against product when dimension of product is measured: 100 g), the outside diameters of 1,000,000 outer rings of a bearing corresponding to 608 bearing were measured to observe the frictional situation of the flat portion of the vernier caliper. By using a surface roughness measuring instrument (Form•Talysurf PG1830 produced by Taylor Hobson Ltd.), wear depths with respect to the reference surface was computed. Vernier calipers which had wear depths of less than 1 μm were recorded as "○". Those which had wear depths of not less than 1 μm and less than 3 μm were recorded as "Δ". Those which had wear depths of not less than 3 μm were recorded as "x". Table 13 shows the results.

TABLE 13

| No. | Film-forming condition | Model part | Evaluation method | Result of evaluation |
|---|---|---|---|---|
| 1 | Same as that of film formation example 4-1 | Stopper gauge A | Stopper gauge test A | ◯ |
| 2 | | Stopper gauge B | Stopper gauge test B | ◯ |
| 3 | | Vernier caliper | Vernier caliper measuring test | ◯ |
| 4 | Same as that of film formation example 4-3 | Stopper gauge A | Stopper gauge test A | ◯ |
| 5 | | Stopper gauge B | Stopper gauge test B | ◯ |
| 6 | | Vernier caliper | Vernier caliper measuring test | ◯ |
| 7 | Same as that of film formation example 4-9 | Stopper gauge A | Stopper gauge test A | ◯ |
| 8 | | Stopper gauge B | Stopper gauge test B | ◯ |
| 9 | | Vernier caliper | Vernier caliper measuring test | ◯ |
| 10 | Untreated (film is not formed on surface) | Stopper gauge A | Stopper gauge test A | X |
| 11 | | Stopper gauge B | Stopper gauge test B | X |
| 12 | | Vernier caliper | Vernier caliper measuring test | X |
| 13 | Same as that of film formation example 4-14 | Stopper gauge A | Stopper gauge test A | X |
| 14 | | Stopper gauge B | Stopper gauge test B | Δ |
| 15 | | Vernier caliper | Vernier caliper measuring test | Δ |

As shown in table 13, it is understood that even after the dimensions of 100,000 to 1,000,000 products were measured by the dimension-measuring jig, the dimension-measuring jig on which the hard film having the predetermined structure was formed had a small amount of deformation and can be made much longer in the life length thereof than conventional dimension-measuring jigs.

INDUSTRIAL APPLICABILITY

The rolling bearing of the present invention is excellent in the peeling resistances of the hard film, containing the DLC film, which is formed on the raceway of the inner and outer rings and the rolling contact surfaces of the rolling elements and thus the intrinsic properties of the DLC film can be displayed. Thereby the rolling bearing of the present invention is excellent in its resistance to seizing, wear, and corrosion. Therefore the rolling bearing of the present invention is applicable to various uses including uses in a strict lubrication state.

EXPLANATION OF REFERENCE NUMERALS AND SYMBOLS

1: rolling bearing
2: inner ring
3: outer ring
4: rolling element
5: cage
6: sealing member
7: grease
8: hard film
11: bias power source
12: base material
13: film (layer)
15: target
16: magnetic field lines
17: Ar ion
18: ionized target
19: high-density plasma
21: vaporization source material
22: disk
23: base material
24: sputter vaporization source material
31: specimen
32: mating material
33: arm portion
34: load
35: load cell
51: specimen
52: rolling element
53: aligning ball
54: rotary ball spline
55: bearing washer
56: heater
57: thermocouple
61: specimen bearing
62: load-applying ball bearing
63: load-applying coil spring
64: driving pulley
65: shaft
71: specimen bearing
72: pulley
73: load-applying coil spring
74: cartridge heater
75: thermocouple

The invention claimed is:
1. A rolling bearing comprising:
an inner ring having a raceway on an outer circumferential surface thereof, an outer ring having a raceway on an inner circumferential surface hereof, a plurality of rolling elements which roll between said raceway of said inner ring and said raceway of said outer ring, and a cage retaining said rolling elements,
wherein at least one bearing member selected from among said inner ring, said outer ring, said rolling elements, and said cage is made of an iron-based material,
wherein said bearing member made of said iron-based material has a curved surface, a hard film is formed on said curved surface, said curved surface is at least one curved surface selected from among said raceway of said inner ring, said raceway of said outer ring, said rolling contact surfaces of said rolling elements, and a sliding contact surface of said cage,
wherein said hard film is composed of a foundation layer, composed mainly of chromium, which is formed directly on said curved surface; a mixed layer, composed mainly of tungsten carbide and diamond-like carbon, which is formed on said foundation layer; and a surface layer, composed mainly of said diamond-like carbon, which is formed on said mixed layer,
wherein said surface layer has a gradient layer part, disposed at a side adjacent to said mixed layer, said gradient layer part having a structure, in which a structure ratio between a graphite structure and a diamond structure in said diamond-like carbon of said gradient layer part, which inclines toward the diamond structure as a distance from said mixed layer increases, thus said gradient layer part being formed so that hardness of said gradient layer part becomes higher continuously or stepwise from said mixed layer and wherein a content rate of said tungsten carbide in said mixed layer becomes lower continuously or stepwise in a direction from a side of said foundation layer toward a side of said surface layer, and a content rate of said diamond-like carbon in said mixed layer becomes higher continuously or stepwise in said direction.

2. A rolling bearing according to claim 1, wherein said rolling elements are balls; and said raceway of said inner ring and said raceway of said outer ring are curved surfaces which guide said rolling elements.

3. A rolling bearing according to claim 1, wherein said rolling elements are balls; and said sliding contact surface of said cage is a pocket surface which retains said balls thereon and allows said rolling elements to slide thereon.

4. A rolling bearing according to claim 1, wherein said surface layer consists of a film formed by using an unbalanced magnetron sputtering apparatus using argon gas as a sputtering gas, said surface layer being formed by using a graphite target and a hydrocarbon-based gas in combination as a carbon supply source and depositing carbon atoms generated by said carbon supply source on said mixed layer in conditions in which a rate of an introduction amount of said hydrocarbon-based gas to 100 which is an introduction amount of said argon gas into said apparatus is set to 1 to 5, a vacuum degree inside said apparatus is set to 0.2 to 0.8 Pa, and a bias voltage to be applied to said bearing member which is a base material is set to 70 to 150V.

5. A rolling bearing according to claim 4, wherein said hydrocarbon-based gas is methane gas.

6. A rolling bearing according to claim 1, wherein said surface layer consists of a film formed by using an unbalanced magnetron sputtering apparatus using argon gas as a sputtering gas, said surface layer being formed by using a graphite target and a hydrocarbon-based gas in combination as a carbon supply source and depositing carbon atoms generated by said carbon supply source on said mixed layer in conditions in which a rate of an introduction amount of said hydrocarbon-based gas to 100 which is an introduction amount of said argon gas into said apparatus is set to 1 to 5, a vacuum degree inside said apparatus is set to 0.2 to 0.8 Pa, and a bias voltage to be applied to said bearing member which is a base material is set to 70 to 150V, wherein said gradient layer part of said surface layer consists of a film formed by continuously or stepwise increasing said bias voltage to be applied to said bearing member which is said base material.

7. A rolling bearing according to claim 1, wherein each of said foundation layer and said mixed layer consists of a film formed by using an unbalanced magnetron sputtering apparatus using argon gas as a sputtering gas, and said mixed layer consists of a film formed by continuously or stepwise raising a sputtering electric power to be applied to a graphite target serving as a carbon supply source and by continuously or stepwise lowering a sputtering electric power to be applied to a tungsten carbide target.

8. A rolling bearing according to claim 1, wherein, a specific wear amount of said hard film is less than $200 \times 10^{-10}$ mm$^3$/(Nm) as a mating material consisting of a quenched steel of SUJ2 having a surface roughness Ra of not more than 0.01 mg and Vickers hardness Hv of 780 is rotated at a rotational speed of 0.05 m/s for 30 minutes in contact with said hard film by applying a load of 0.5 GPa to said hard film in a Hertzian maximum contact surface pressure.

9. A rolling bearing according to claim 1, wherein in said hard film, a sum of an average value of indentation hardnesses and a standard deviation value is 25 to 45 GPa.

10. A rolling bearing according to claim 1, wherein a critical peeling load of said hard film in a scratch test is not less than 50N.

11. A rolling bearing according to claim 1, wherein a thickness of said hard film is 0.5 to 3.0 µm; and a ratio of a thickness of said surface layer to that of said hard film is not more than 0.8.

12. A rolling bearing according to claim 1, wherein an iron-based material constructing said inner ring, said outer ring, and said rolling elements is high carbon chromium bearing steel, carbon steel, tool steel or martensitic stainless steel.

13. A rolling bearing according to claim 12, wherein a hardness of a curved surface of each of said inner ring, said outer ring, and said rolling elements on which said hard film is to be formed is not less than 650 in Vickers hardness Hv.

14. A rolling bearing according to claim 1, wherein an iron-based material constructing said cage is a cold-rolled steel plate, carbon steel, chromium steel, chromium molybdenum steel, nickel chromium molybdenum steel or austenitic stainless steel.

15. A rolling bearing according to claim 14, wherein a hardness of a curved surface of said cage on which said hard film is to be formed is not less than 450 in Vickers hardness Hv.

16. A rolling bearing according to claim 1, wherein before said hard film is formed on said curved surface on which said hard film is to be formed, a nitrided layer is formed thereon by performing nitriding treatment.

17. A rolling bearing according to claim 16, wherein as said nitriding treatment, plasma nitriding treatment is performed; and a hardness of said curved surface subjected to said nitriding treatment is not less than 1000 in Vickers hardness Hv.

18. A rolling bearing according to claim 1, wherein a surface roughness Ra of said curved surface of each of said inner ring, said outer ring, and said rolling elements on which said hard film is to be formed is not more than 0.05 mµ.

19. A rolling bearing according to claim 1, wherein a surface roughness Ra of said curved surface of said cage on which said hard film is to be formed is not more than 0.5 mµ.

20. A rolling bearing according to claim 1, wherein grease is packed at least on a periphery of each of said rolling elements.

21. A rolling bearing according to claim 20, wherein said grease is fluorine grease composed of base oil consisting of perfluoropolyether oil and a thickener consisting of fluororesin powders.

* * * * *